(12) United States Patent
Onishi et al.

(10) Patent No.: US 8,969,898 B2
(45) Date of Patent: Mar. 3, 2015

(54) SEMICONDUCTOR LIGHT EMITTING ELEMENT AND METHOD FOR PRODUCING THE SAME

(71) Applicant: Nichia Corporation, Anan-shi, Tokushima (JP)

(72) Inventors: Masahiko Onishi, Anan (JP); Shun Kitahama, Tokushima (JP)

(73) Assignee: Nichia Corporation, Anan-Shi (JP)

( * ) Notice: Subject to any disclaimer, the term of this patent is extended or adjusted under 35 U.S.C. 154(b) by 0 days.

(21) Appl. No.: 13/772,562

(22) Filed: Feb. 21, 2013

(65) Prior Publication Data

US 2013/0214320 A1 Aug. 22, 2013

(30) Foreign Application Priority Data

Feb. 21, 2012 (JP) ................................. 2012-034939

(51) Int. Cl.
| | | |
|---|---|---|
| H01L 33/00 | (2010.01) | |
| H01L 33/40 | (2010.01) | |
| H01L 33/38 | (2010.01) | |
| H01L 33/44 | (2010.01) | |

(52) U.S. Cl.
CPC ............... *H01L 33/40* (2013.01); *H01L 33/38* (2013.01); *H01L 33/44* (2013.01); *H01L 2933/0016* (2013.01)
USPC .................. 257/98; 257/99; 257/100; 438/43

(58) Field of Classification Search
CPC ............................... H01L 33/00; H01L 33/50

USPC ..................................................... 257/79–103
See application file for complete search history.

(56) References Cited

U.S. PATENT DOCUMENTS

| 6,197,609 B1 | 3/2001 | Tsutsui et al. | |
|---|---|---|---|
| 2008/0185606 A1* | 8/2008 | Sano et al. | 257/98 |
| 2012/0001221 A1* | 1/2012 | Choi | 257/99 |
| 2012/0299046 A1* | 11/2012 | Itonaga | 257/99 |

FOREIGN PATENT DOCUMENTS

| JP | 10-107316 A | 4/1998 |
|---|---|---|
| JP | 10-173229 A | 6/1998 |
| JP | 2000-91636 A | 3/2000 |
| JP | 3117281 U | 11/2005 |
| JP | 2008-227018 A | 9/2008 |

* cited by examiner

*Primary Examiner* — Cheung Lee
*Assistant Examiner* — Frederick B Hargrove
(74) *Attorney, Agent, or Firm* — Squire Patton Boggs (US) LLP

(57) ABSTRACT

In a method for producing a semiconductor light emitting device: a semiconductor lamination of first and second semiconductor layers having different conductive types is formed; a portion of the semiconductor lamination is removed to expose an area of a surface of the first semiconductor layer; a conductor layer connecting the first and second semiconductor layers is formed; a first electrode is formed on the exposed areas of the first semiconductor layer and a second electrode is formed on an upper surface of the second semiconductor layer; a barrier layer covering at least one of the first and second electrodes is formed; and a connection part in the conductor layer connecting the first and second semiconductor layers is removed.

15 Claims, 10 Drawing Sheets

SEMICONDUCTOR LIGHT EMITTING ELEMENT AND METHOD FOR PRODUCING THE SAME

CROSS REFERENCE TO RELATED APPLICATION

This application claims the priority of Japanese Application No. 2012-034939, filed on Feb. 21, 2012, the entire specification, claims and drawings of which are incorporated herewith by reference.

BACKGROUND OF THE INVENTION

1. Field of the Invention

The present invention relates to a semiconductor light emitting device having electrodes formed of metallic material on surfaces of a semiconductor lamination. In addition, the present invention also relates to a method for producing the above semiconductor light emitting device.

2. Description of the Related Art

The semiconductor light emitting devices each include a semiconductor lamination formed by successively stacking an n-type semiconductor layer and a p-type semiconductor layer on a substrate so as to emit light when the semiconductor lamination is energized. Electrodes needed for the energization are formed on the semiconductor lamination, and the surfaces of the electrodes are covered by protection films of insulating material preventing occurrence of a short circuit. In the manufacture of such semiconductor light emitting devices, production methods in which multiple elements are concurrently produced are used. In such production methods, first, a semiconductor lamination is formed by successively stacking an n-type semiconductor layer and a p-type semiconductor layer on a substrate. Then, structures of multiple semiconductor light emitting devices are formed on the semiconductor lamination in a matrix arrangement. Finally, the substrate on which the above structures are formed are separated into the individual semiconductor light emitting devices by cleaving the substrate (for example, see JP 2000-091636 A or JP 10-173229 A).

According to another known technique different from the above semiconductor light emitting devices, a single light emitting device is produced by arranging multiple blocks of semiconductor laminations (semiconductor lamination blocks) on a single substrate and connecting the multiple blocks in series (for example, see JP 10-107316 A or JP 3117281 U). In the above arrangement, each of the multiple semiconductor-lamination blocks corresponds to a single conventional light emitting device. Therefore, the quantity of light| emitted by the light emitting device constituted by multiple semiconductor-lamination blocks can be equivalent to the quantity of light emitted from an aggregation of multiple separate light emitting devices. The above light emitting device constituted by multiple (e.g., four) semiconductor-lamination blocks can be produced as follows. That is, first, semiconductor laminations are formed by successively stacking an n-type semiconductor layer and a p-type semiconductor layer on a large-size substrate. Then, multiple semiconductor-lamination blocks are formed in the above semiconductor lamination in a matrix arrangement. Subsequently, the four semiconductor-lamination blocks, which are to finally constitute a light emitting device, are electrically connected. Finally, the substrate is divided into portions respectively corresponding to the four semiconductor-lamination blocks.

Further, JP 2008-227018 A discloses a method for producing a semiconductor light emitting device. In the method described in JP 2008-227018 A, multiple semiconductor light emitting devices are formed in a matrix arrangement on a single substrate, and the substrate is finally cleaved into the individual semiconductor light emitting devices. Specifically, a connection part making a short circuit between an n-type semiconductor layer in a semiconductor light emitting device and a p-type semiconductor layer in an adjacent semiconductor light emitting device is formed, and metal electrodes are formed while the above short circuit is maintained. Thereafter, the n-type semiconductor layer and the p-type semiconductor layer are electrically separated by cutting off the connection part when the individual light emitting devices in the matrix arrangement are separated by cleavage.

In all of the above examples of production methods of semiconductor light emitting devices briefly described above, multiple semiconductor light emitting devices can be concurrently produced by concurrently forming structures of multiple semiconductor light emitting devices on a single substrate, and thereafter dividing the substrate into predetermined dimensions.

The semiconductor light emitting devices disclosed in JP 2000-091636 A, JP 10-173229 A, JP 10-107316 A, and JP 3117281 U have electrodes formed of metal, such as metal pad electrodes for wire bonding and metal thin-film electrodes formed on surfaces of the semiconductor lamination for current diffusion, respectively. In order to form such electrodes, the lift-off technique is used. That is, photoresist is applied over the entire surface of the semiconductor lamination on which electrodes are to be formed, and openings are formed by photolithography in the photoresist at positions at which the electrodes are to be formed. Then, a metal film is formed over the entire surface of the semiconductor lamination, and thereafter the portions of the metal film which are located on the remaining photoresist are removed by lift-off. Thus, the electrodes are formed at the predetermined positions.

In the case where the electrodes are formed by the lift-off technique as above, when the portions of the metal film are lifted off, the material constituting the electrodes causes migration and metal precipitates at various positions in the semiconductor lamination. Since the metal precipitated by migration can cause a short circuit between the n-type semiconductor layer and the p-type semiconductor layer, it is necessary to prevent migration to the greatest extent practicable. Therefore, the metals which are likely to cause migration, such as silver (Ag), have been considered not to be suitable for constituting electrodes.

On the other hand, since Ag is a material exhibiting high electric conductivity and high reflectance, there are strong demands for use of Ag as a material constituting electrodes in the semiconductor light emitting devices for the purpose of increase in the emission efficiency in the semiconductor light emitting devices.

According to the method for producing a semiconductor light emitting device disclosed in JP 2008-227018 A, migration of the materials such as Ag in the electrodes are prevented by forming the electrodes while the potentials of the n-type semiconductor layer and the p-type semiconductor layer are equalized by making a short circuit between the n-type semiconductor layer and the p-type semiconductor layer.

However, according to the method for producing a semiconductor light emitting device disclosed in JP 2008-227018 A, in order to prevent migration of the material constituting the electrodes, it is necessary to preserve the connection part equalizing the potentials of the n-type semiconductor layer and the p-type semiconductor layer until the final step in which the substrate is divided into the individual semiconductor light emitting devices. In addition, since the connection part is arranged between the adjacent semiconductor light emitting devices, the freedom of design of the structures of the semiconductor light emitting devices is limited. Consequently, there are demands for a production method which can achieve a higher degree of freedom of production steps and a higher degree of freedom of device structures.

In view of the above, the object of the present invention is to provide a method for producing a semiconductor light emitting device which can prevent migration during production and achieve a high degree of freedom of production steps and a high degree of freedom of device structures.

SUMMARY OF THE INVENTION

In order to achieve the above object, according to the present invention, a method for producing a semiconductor light emitting device is provided. The semiconductor light emitting device produced by the above method includes a semiconductor lamination formed by successively stacking a first semiconductor layer and a second semiconductor layer on a substrate, a first electrode electrically connected to the first semiconductor layer, and a second electrode electrically connected to the second semiconductor layer, where first and second semiconductor layers have different conductive types. (For example, when the first semiconductor layer is n-type, the second semiconductor layer is p-type.) The method includes: an exposing step of exposing the first semiconductor layer; a conductor layer forming step of forming a conductor layer; an electrode forming step of forming the electrodes; a barrier layer forming step of forming a barrier layer; and a connection part removing step of removing a (conductor layer) connection part.

Also, according to the present invention, a semiconductor light emitting device including: a substrate; a semiconductor lamination arranged on the substrate; a conductor layer arranged on areas of the semiconductor lamination; electrodes arranged on the conductor layer; and a barrier layer covering the conductor layer and the electrodes. In the above semiconductor light emitting device, the barrier layer covers areas of upper surfaces of the conductor layer extending to vicinities of edges of the conductor layer exposed from the electrode, is provides.|

DETAILED DESCRIPTION OF THE INVENTION

Figure 1A:
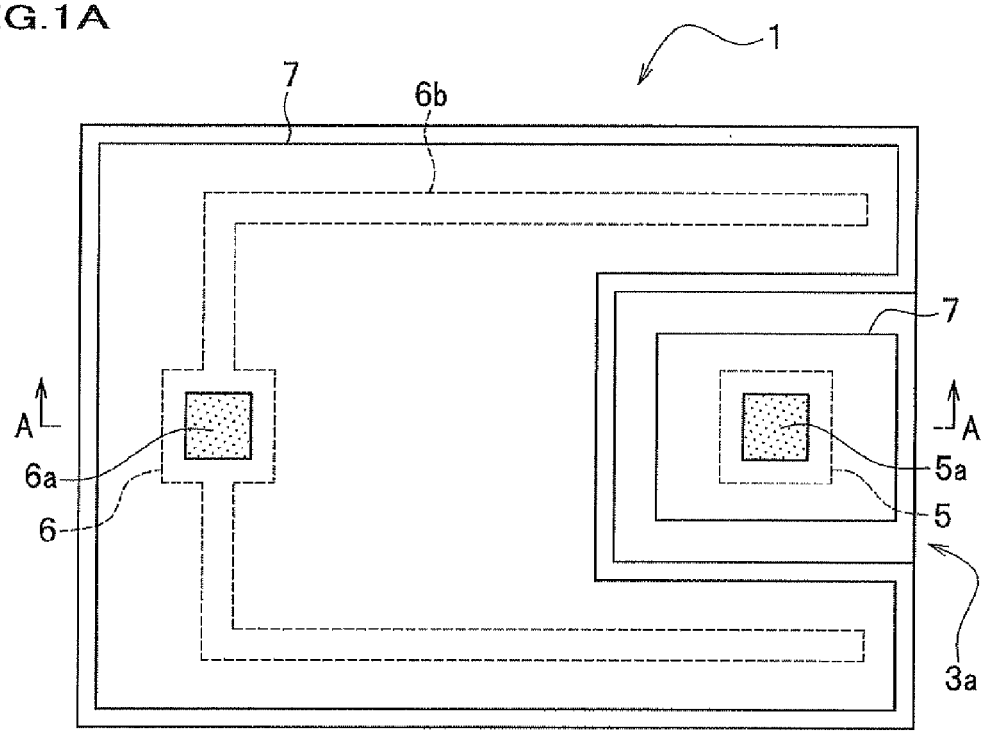
FIG. 1A is a schematic plan view of a semiconductor light emitting device according to a first embodiment of the present invention.

First, according to the above method, in the exposing step, part of the semiconductor lamination (formed by successively stacking the first semiconductor layer and the second semiconductor layer on the substrate) is removed so as to form a step region (e.g., a recessed region) in such a manner that the first semiconductor layer is exposed at the bottom surface of the step region. Then, in the conductor layer forming step, a conductor layer which makes a short circuit between the first and second semiconductor layers (i.e., connects the first and second semiconductor layers) is formed so that the potentials of the first and second semiconductor layers are equalized.

Next, in the electrode forming step, the first electrode is formed on the exposed area of the surface of the first semiconductor layer at the bottom surface of the step region, and the second electrode is formed on the upper surface of the second semiconductor layer. Since the potentials of the first and second semiconductor layers are equalized by the short circuit realized by the conductor layer between the first and second semiconductor layers, it is possible to prevent migration of the material constituting the electrodes in the electrode forming step.

Next, in the barrier layer forming step, a barrier layer which covers at least one of the first and second electrodes is formed. Finally, in the connection part removing step, the conductor layer in the connection part realizing the short circuit between the first and second semiconductor layers is removed. For example, the removed conductor layer is a conductor layer arranged on the side faces of the step region. Since the barrier layer covers at least one of the first and second electrodes, it is possible to prevent migration of the material constituting the electrodes even when the removal of the connection part of the conductor layer causes a difference between the potentials of the first and second semiconductor layers.

In the method according to an embodiment, the second electrode is preferably formed over the second semiconductor layer through the conductor layer. In addition, the first electrode is preferably formed over the exposed surface of the first semiconductor layer through the conductor layer.

According to the above method, the first and second electrodes are covered by the conductor layer and the barrier layer, so that migration of the material constituting the electrodes can be more effectively prevented.

In the method according to the embodiment, at least one of the first and second electrodes preferably contains Ag or Ag alloy.

According to the above method, it is possible to prevent migration of the material constituting the electrodes even in the case where the material constituting the electrodes contains Ag, although Ag is known to be likely to cause migration.

In the method according to the embodiment, in the barrier layer forming step, a film of metal oxide is preferably formed as the barrier layer by atomic layer deposition.

According to the above method, the atomic layer deposition enables formation of a |dense, uniform barrier layer of the metal oxide covering the electrodes. Therefore, migration of the material constituting the electrodes can be more effectively prevented.

In the method according to the embodiment, the metal oxide is preferably $Al_2O_3$.

According to the above method, the barrier layer of $Al_2O_3$ formed by atomic layer deposition exhibits high barrier properties against moisture, which can cause migration. Therefore, migration of the material constituting the electrodes can be further effectively prevented.

In the method according to the embodiment, the barrier layer covering the first or second electrode is preferably formed of a metal or an alloy which is different from a metal or an alloy of which the first or second electrode is formed.

According to the above method, it is unnecessary to expose the electrodes for connection to external electrodes for wiring, since the barrier layer is formed of a metal or an alloy different from the metal or alloy of which the first or second electrode is formed. Therefore, the first or second electrode is completely covered by the barrier layer even after the production, so that migration of the material constituting the electrodes can be effectively prevented.

In the method according to the embodiment, the conductor layer preferably contains as a main component an oxide constituted by at least one of the elements Zn, In, Sn, Ga, and Ti.

According to the above method, the conductor layer containing as a main component an oxide constituted by one or more of the above elements becomes transparent. Therefore, the semiconductor light emitting device produced by the above method can emit light through the conductor layer.

In the method according to the embodiment, the conductor layer is preferably transparent at the wavelength of the light emitted by the semiconductor light emitting device produced by the above method.

According to the above method, the semiconductor light emitting device produced by the above method can emit light through the conductor layer.

Preferably, the method according to the embodiment further includes a protection-film forming step of forming a protection film which is executed after the connection part removing step.

According to the above method, in the connection part removing step, the conductor layer, which is arranged (as the connection part connecting the first and second semiconductor layers) on the side surface of the step region, is removed, and the side surface of the step region is exposed. Thereafter, in the protection-film forming step, a protection film of insulating material is formed so as to cover at least the conductor layer and the upper surface and the side surfaces of the semiconductor lamination, where the side surfaces of the semiconductor lamination include the side surfaces of the step region. At this time, the barrier layer covers at least one of the first and second electrodes. Therefore, migration of the material constituting the electrodes can be effectively prevented. That is, the protection film can be formed on the side surfaces of the step region (in which the connection part realized by the conductor layer is arranged) without causing migration.

According to the above structure, the barrier layer has an approximately identical shape in plan view to the shape of the conductor layer, so that the barrier layer can achieve satisfactorily barrier properties. Therefore, migration of the material constituting the electrodes which are covered by the barrier layer and the conductor layer can be effectively prevented. In addition, since the barrier layer covers almost the entire areas of the upper surfaces of the conductor layer which are exposed out of the electrodes, and the areas of the barrier layer which are in contact with the conductor layer are great. Therefore, the adhesiveness of the barrier layer to the conductor layer is high.

According to the method of the embodiment, in order to prevent migration of the material constituting the electrodes during formation of the electrodes by equalizing the potentials of the semiconductor layers with a short circuit between the semiconductor layers, the electrodes can be formed of various materials. In addition, since the electrodes are covered by forming the barrier layer after formation of the electrodes, migration can be prevented even in the steps after the short circuit between the semiconductor layers is removed. Further, since failure caused by migration does not occur in the semiconductor light emitting device produced by the method according to the embodiment, the semiconductor light emitting device produced by the method according to the embodiment has stable quality.

Further, according to the method of the embodiment enables use of Ag in the electrodes, and Ag exhibits high reflectance, the method according to the embodiment enables production of a semiconductor light emitting device achieving high light-output efficiency.

Further, since the method according to the embodiment can prevent migration of the material constituting the electrodes by formation of the barrier layer of metal oxide by atomic layer deposition, the method according to the embodiment can produce a semiconductor light emitting device which is improved in the stability of the quality.

Still further, since the method according to the embodiment can further effectively prevent migration of the material constituting the electrodes by arrangement of the barrier layer being formed of $Al_2O_3$ by atomic layer deposition and having higher barrier properties, the method according to the embodiment can produce a semiconductor light emitting device which is further improved in the stability of the quality.

Further, according to the method of the embodiment, the electrodes can be covered with the barrier layer containing a metal or alloy different from the material constituting the electrodes, so that the electrodes are not exposed. Therefore, migration of the material constituting the electrodes can be prevented even after production of the semiconductor light emitting device. Therefore, the method according to the embodiment enables production of a semiconductor light emitting device having stable quality.

Further, the semiconductor light emitting device produced by the method according to the embodiment can emit light through a conductor layer. Therefore, in the case where a conductor layer is formed as a full-surface electrode on the upper surface of the semiconductor lamination, the method according to the embodiment can produce a semiconductor light emitting device suitable for face-up mounting, in which light is emitted from the semiconductor lamination side. Further, since the electrodes are covered by the conductor layer and the barrier layer and therefore migration can be more effectively prevented, the method according to the embodiment can produce a semiconductor light emitting device having further stable quality.

Still further, since the protection film can be formed on the side surfaces of the step region in the semiconductor lamination according to the method of the embodiment, a semiconductor light emitting device whose semiconductor lamination is prevented from deterioration and whose lifetime is long can be produced.

The methods for producing a semiconductor light emitting device according to the first and second embodiments of the present invention are explained below with reference to the accompanying drawings. In the following explanations on the embodiments, the semiconductor light emitting devices are light emitting diodes (LEDs).

First Embodiment

Structure of Semiconductor Light Emitting Device

The first embodiment is explained below with reference to FIGS. 1A and 1B.

The structure of the semiconductor light emitting device according to the first embodiment is explained below with reference to FIGS. 1A and 1B. FIG. 1A is a schematic plan view of the semiconductor light emitting device according to the first embodiment of the present invention, and FIG. 1B is a schematic cross-sectional view of the semiconductor light emitting device of FIG. 1A at the A-A cross section indicated in FIG. 1A.

Figure 1B:
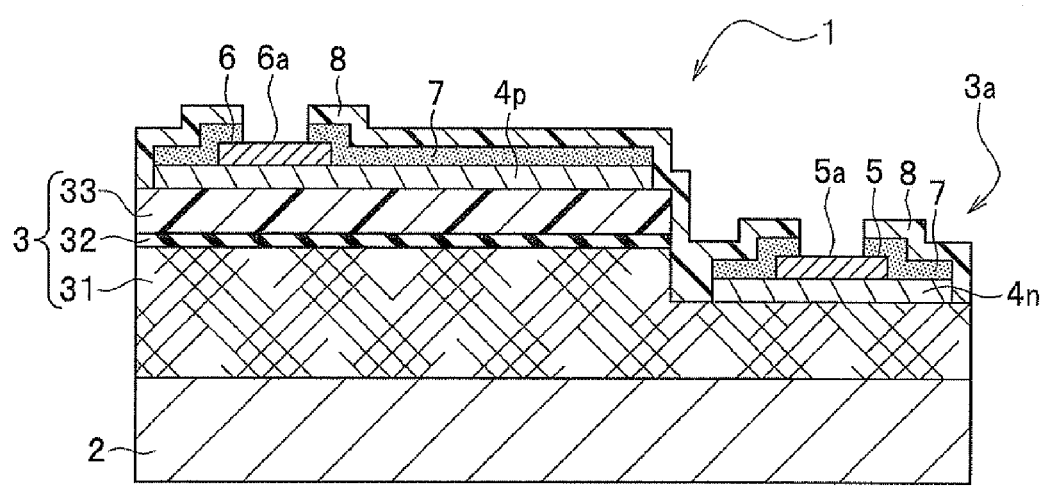
FIG. 1B is a schematic cross-sectional view of the semiconductor light emitting device of FIG. 1A at the A-A cross section indicated in FIG. 1A.

As shown in FIG. 1A and FIG. 1B, the semiconductor light emitting device 1 includes a semiconductor lamination 3 on a surface of a substrate 2. In the semiconductor lamination 3, an n-type semiconductor layer 31 and a p-type semiconductor layer 33 are stacked on the substrate 2 in such a manner that the semiconductor lamination 3 emits light when the semiconductor lamination 3 is energized with electric current. Preferably, an active layer 32 is arranged between the n-type semiconductor layer 31 and the p-type semiconductor layer 33.

The p-type semiconductor layer 33 and the active layer 32 are not formed in a region of the semiconductor lamination 3, so that the semiconductor lamination 3 is recessed in the region. Hereinafter, the part in the semiconductor lamination 3 on the recessed region is referred to as a step region 3a. The bottom surface of the step region 3a is an exposed area of the n-type semiconductor layer 31, and an n electrode 5 is formed on the bottom surface via a full-surface electrode 4n. In addition, a p electrode 6 is formed on the upper surface of the p-type semiconductor layer 33 via a full-surface electrode 4p. The n electrode 5 and the p electrode 6 are pad electrodes arranged for connection to external electrodes arranged on a mount board by wire bonding or the like. An area 5a of the upper surface of the n electrode 5 is exposed for the connection, and is referred to as an exposed area 5a. In addition, an area 6a of the upper surface of the p electrode 6 is exposed for the connection, and is referred to as an exposed area 6a.

Further, the upper surfaces of the full-surface electrode 4n and the full-surface electrode 4p are covered by an insulation film 7. Furthermore, the surface of the entire upper surface of the semiconductor light emitting device 1 except the exposed area 5a of the n electrode 5 and the exposed area 6a of the p electrode 6 are covered by a protection film 8 (although the protection film 8 is not shown in the plan view of FIG. 1A).

(Substrate)

The substrate 2 may be formed of any material which enables epitaxial growth of the semiconductor lamination 3. The dimensions and the thickness of the support substrate 1 are not specifically limited. For example, in the case where the semiconductor lamination 3 is formed of nitride semiconductors such as GaN-based semiconductor (where GaN is gallium nitride), the substrate 2 is formed of, for example, an insulative substrate such as a substrate of sapphire or spinel ($MgAl_2O_4$) having one of the C face, the R face, and the A face as the principal plane, or a substrate of silicon carbide (SiC), silicon (Si), ZnS, ZnO, GaAs, or diamond, or a substrate of an oxide (such as lithium niobate or neodymium gallate) which lattice-matches with the nitride semiconductor.

In addition, in the case where the substrate 2 is an insulating substrate, the substrate 2 may be finally removed or may be left in the semiconductor light emitting device 1. In the case where the substrate 2 is left in the semiconductor light emitting device 1, it is preferable to form both of the n electrode 5 and the p electrode 6 on one side of the semiconductor lamination 3. Further, the light-output face of the semiconductor light emitting device 1 may be arranged on either of the semiconductor lamination 3 side (front side) or the substrate 2 side (back side).

In the case where the light-output face is arranged on the semiconductor lamination 3 side (front side), i.e., in the case where the semiconductor light emitting device 1 is a face-up mount type, it is preferable to arrange a reflection layer realized by a metal film or a multilayer dielectric film on the back side of the substrate 2 in order to reflect upward the light propagating downward in the semiconductor light emitting device 1.

In the case where the light-output face is arranged on the substrate 2 side (back side), i.e., in the case where the semiconductor light emitting device 1 is a face-down mount type, it is preferable that the substrate 2 be transparent to the light emitted from the semiconductor light emitting device 1 in order to emit the light through the substrate 2.

(Semiconductor Lamination)

As mentioned before, in the semiconductor lamination 3, an n-type semiconductor layer 31 and a p-type semiconductor layer 33 are stacked. In addition, the step region 3a, in which the entire thicknesses of the p-type semiconductor layer 33 and the active layer 32 and a part of the thickness of the n-type semiconductor layer 31 are removed, is formed in a region of the semiconductor lamination 3. Further, an electrode electrically connected to the n-type semiconductor layer 31 is formed on the bottom surface of the step region 3a by stacking the full-surface electrode 4n and the n electrode 5. Furthermore, an electrode electrically connected to the p-type semiconductor layer 33 is formed on the upper surface of the p-type semiconductor layer 33 (i.e., the upper surface of the semiconductor lamination 3 except for the step region 3a) by stacking the full-surface electrode 4p and the p electrode 6.

The semiconductor lamination 3 can be formed of materials suitable for semiconductor light emitting devices such as GaN, GaAs, InGaN, AlInGaP, GaP, SiC, or ZnO. In particular, it is preferable to use Ag (which exhibits high reflectance of light at short wavelengths) as the material constituting the electrodes in the semiconductor light emitting devices emitting light at short wavelengths such as blue or violet light.

(N-Type Semiconductor Layer (First Semiconductor Layer), Active Layer, and P-Type Semiconductor Layer (Second Semiconductor Layer))

The GaN-based compound semiconductors, for example, having the composition $In_XAl_YGa_{1-X-Y}N$ ($0 \leq X$, $0 \leq Y$, $X+Y \leq 1$) can be preferably used in the n-type semiconductor layer 31, the active layer 32, and the p-type semiconductor layer 33. Although these semiconductor layers have a monolayer structure, they may have a laminated or superlattice structure formed of sublayers having different compositions and thicknesses, etc. In particular, the active layer 32 preferably has a single quantum well structure or a multiple quantum well structure, which is formed by laminating thin films so as to produce a quantum effect.

In addition, the above semiconductor layers may be formed to have a homostructure, a heterostructure, or a double heterostructure containing a MIS (metal-insulator-semiconductor) junction, a PIN junction, or a PN junction. Layers of the GaN-based compound semiconductors can be formed by a known technique, for example, MOCVD (organometallic vapor phase growth), HVPE (hydride vapor phase epitaxy), or MBE (molecular beam epitaxy). Further, the thicknesses of the semiconductor layers are not specifically limited.

The laminated structure of the semiconductor layers may include, for example, a buffer layer of AlGaN, a layer of undoped GaN, an n-type contact layer of Si-doped n-type GaN, a superlattice layer in which GaN sublayers and InGaN sublayers are alternately laminated, an active layer having a multiple quantum well structure in which GaN sublayers and InGaN sublayers are alternately laminated, a superlattice layer in which Mg-doped AlGaN sublayers and Mg-doped InGaN sublayers are alternately laminated, a p-type contact layer of Mg-doped p-type GaN, and the like.

(Full-Surface Electrode (Conductor Layer))

The full-surface electrode 4n is arranged to cover the almost entire bottom face of the step region 3a (at which an area of the n-type semiconductor layer 31 is exposed), and the full-surface electrode 4p is arranged to cover the almost entire upper surface of the p-type semiconductor layer 33. The full-surface electrode 4n is a conductor layer for uniformly diffusing to the entire n-type semiconductor layer 31 the current supplied through the n electrode 5 (which is arranged on a part of the upper surface of the n-type semiconductor layer 31). Similarly, the full-surface electrode 4p is a conductor layer for uniformly diffusing to the entire p-type semiconductor layer 33 the current supplied through the p electrode 6 (which is arranged on a part of the upper surface of the p-type semiconductor layer 33).

That is, the n electrode 5 is arranged on a part of the upper surface of the full-surface electrode 4n, and the p electrode 6 is arranged on a part of the upper surface of the p electrode 6. The other part of each of the full-surface electrode 4n and the full-surface electrode 4p are doubly covered by the insulation film 7 and the protection film 8.

The full-surface electrodes 4n and 4p are preferably ohmic electrodes which can be satisfactorily connected to the n-type semiconductor layer 31 and the p-type semiconductor layer 33, respectively. In addition, in the case where the semiconductor light emitting device 1 is the face-up mount type, it is preferable that the full-surface electrodes 4n and 4p be satisfactorily transparent at least at the wavelengths of the light emitted from the active layer 32. In the case where the semiconductor light emitting device 1 is the face-down mount type, the full-surface electrodes 4n and 4p may be formed of a material (e.g., a metal) which can reflect toward the substrate side the light emitted from the active layer 32.

Further, the full-surface electrodes 4n and 4p are integrally formed to be electrically connected to each other during the production process of the semiconductor light emitting device 1. That is, the potentials of the n-type semiconductor layer 31 and the p-type semiconductor layer 33 are equalized by making a short circuit between the n-type semiconductor layer 31 and the p-type semiconductor layer 33 during the production process, so that migration of the metallic material constituting the n electrode 5 and the p electrode 6 is prevented during the production process. Therefore, the full-surface electrodes 4n and 4p are preferably formed of materials exhibiting satisfactory electric conductivity. However, when the production of the semiconductor light emitting device 1 is completed, the full-surface electrode 4n and the full-surface electrode 4p are electrically separated from each other.

The full-surface electrodes 4n and 4p are formed of conductive metal oxide or laminated metallic thin films of Au and Ni. In particular, it is preferable to form the full-surface electrodes 4n and 4p of conductive metal oxide which realizes transparent electrodes. Since migration of the metallic material constituting the n electrode 5 and the p electrode 6, which are respectively formed on the full-surface electrodes 4n and 4p, can be suppressed by the full-surface electrodes 4n and 4p in the above case, it is possible to expect that the formation of the full-surface electrodes 4n and 4p of conductive metal oxide increases the lifetime of the semiconductor light emitting device 1.

For example, the conductive metal oxide may be an oxide constituted by at least one of the elements Zn (zinc), In (indium), Sn (tin), Ga (gallium), and Ti (titanium). Specifically, examples of such conductive metal oxides include ZnO, AZO (Al-doped ZnO), IZO (In-doped ZnO), GZO (Ga-doped ZnO), In$_2$O$_3$, ITO (Sn-doped In$_2$O$_3$), IFO (F-doped In$_2$O$_3$), SnO$_2$, ATO (Sb-doped SnO$_2$), FTO (F-doped SnO$_2$), CTO (Cd-doped SnO$_2$), and TiO$_2$.

Above all, ITO exhibits high electric conductivity and high transparency to visible light (light in the visible region). Therefore, ITO is preferable for the material constituting the full-surface electrodes 4n and 4p. In the case where the full-surface electrodes 4n and 4p are formed of ITO, the thickness of each of the full-surface electrodes 4n and 4p is preferably 10 to 500 nm, and more preferably 50 to 200 nm.

Further, in the case where the full-surface electrode 4n is formed of transparent, electrically conductive metal oxide, it is possible to expect the effect of increasing the light-output efficiency, for the following reason.

Since the light propagating in the semiconductor light emitting device 1 cannot be outputted through the n electrode 5, the light propagating in the semiconductor light emitting device 1 is reflected at the back surface of the n electrode 5. Thereafter, the reflected light propagates in the semiconductor light emitting device 1, and is then outputted. In the case where the full-surface electrode 4n is formed of electrically conductive metal oxide, the light incident on the boundary between the n-type semiconductor layer 31 and the full-surface electrode 4n can be totally reflected (i.e., reflected without loss of light) in some cases according to the refractive indexes of the boundary between the n-type semiconductor layer 31 and the full-surface electrode 4n. Since the totally reflected light is reflected without reaching the full-surface electrode 4n, it is possible to reduce the quantity of light absorbed by the n electrode 5, according to the reflectance of the metallic material constituting the n electrode 5. Therefore, the light-output efficiency in the semiconductor light emitting device 1 can be increased.

Similar to the full-surface electrode 4n, even in the case where the full-surface electrode 4p is formed of transparent, electrically conductive metal oxide, the light incident on the boundary between the p-type semiconductor layer 33 and the full-surface electrode 4p is totally reflected in a certain range of incident angles of the light. That is, the arrangement of the full-surface electrode 4p can reduce the quantity of light which reaches the p electrode 6. Therefore, it is possible to reduce the quantity of light absorbed by the p electrode 6, according to the reflectance of the metallic material constituting the p electrode 6. Thus, the light-output efficiency in the semiconductor light emitting device 1 can be increased.

(N Electrode (First Electrode) and P Electrode (Second Electrode))

As mentioned before, the n electrode 5 is arranged on the aforementioned part of the upper surface of the full-surface electrode 4n, and the p electrode 6 is arranged on the aforementioned part of the upper surface of the p electrode 6. The n electrode 5 and the p electrode 6 are pad electrodes for externally supplying electric current to the semiconductor light emitting device 1. The n electrode 5 is electrically connected to the n-type semiconductor layer 31 through the full-surface electrode 4n, and the p electrode 6 is electrically connected to the p-type semiconductor layer 33 through the full-surface electrode 4p. Therefore, as mentioned before, the area 5a of the upper surface of the n electrode 5 and the area 6a of the upper surface of the p electrode 6 are exposed out of the insulation film 7 and the protection film 8 for the connection to the external electrodes by wire bonding, eutectic bonding, or the like, while the upper surfaces of the full-surface electrodes 4n and 4p except the exposed areas 5a and 6a are covered by the insulation film 7 and the protection film 8.

In the present embodiment, the p electrode 6 has an extension 6b extending from the exposed area 6a to remote areas on the full-surface electrode 4p. The p electrode 6 including the exposed area 6a is formed of a material exhibiting lower electric resistance than the full-surface electrode 4p. Therefore, the arrangement of the exposed area 6a increases the current diffusion efficiency. Although the n electrode 5 does not have an extension in the present embodiment, alternatively, the n electrode 5 may also have an extension.

In addition, although, in the present embodiment, the n electrode 5 and the p electrode 6 are respectively connected to the corresponding semiconductor layers 31 and 33 through the full-surface electrodes 4n and 4p, the n electrode 5 and the p electrode 6 may be connected to the corresponding semiconductor layers 31 and 33 in other manners. For example, one or both of the n electrode 5 and the p electrode 6 may be directly connected to the corresponding one or ones of the semiconductor layers 31 and 33.

The n electrode 5 and the p electrode 6 may be formed of one or more non-alloys or alloys constituted by one or more of Ag, Al, Ni, Rh, Au, Ti, Pt, and W, and may be constituted by a single layer or a lamination of multiple sublayers (e.g., a lamination of sublayers Ag/Ni/Rh/Au formed in this order from the bottom). In the case where the bottom sublayer constituting each of the n electrode 5 and the p electrode 6 (i.e., the sublayer constituting each of the n electrode 5 and the p electrode 6 and located nearest to the corresponding one of the full-surface electrodes 4n and 4p) is formed of Ag, the reflectance of each of the n electrode 5 and the p electrode 6 becomes high, so that the quantity of light absorbed by the n electrode 5 or the p electrode 6 decreases and therefore the emission efficiency in the semiconductor light emitting device 1 increases. That is, it is preferable to form the bottom sublayer constituting each of the n electrode 5 and the p electrode 6 of Ag. Since non-alloys or alloys of Ag or Al exhibits high reflectance regardlessly of the wavelength of light, non-alloys or alloys of Ag or Al can be preferably used as the pad electrodes 5 and 6 in the semiconductor light emitting device regardlessly of the wavelength of light. In particular, blue or violet light is likely to be absorbed by metals other than Ag and Al. Therefore, formation of the pad electrodes 5 and 6 of Ag or Al effectively increases the emission efficiency in the semiconductor light emitting device 1. In order to increase the reflectance at the back surfaces of the n electrode 5 and the p electrode 6, it is preferable that the thickness of the high-reflectance metal sublayer or sublayers be 100 nm or greater.

In the structure in which the n electrode 5 and the p electrode 6 are respectively arranged on the n-type semiconductor layer 31 and the p-type semiconductor layer 33 through the full-surface electrode 4n and the full-surface electrode 4p, and the full-surface electrode 4n and the full-surface electrode 4p are ITO films, the contact resistance at the boundary between the full-surface electrode 4n and the n-type semiconductor layer 31 or at the boundary between the full-surface electrode 4p and the p-type semiconductor layer 33 varies according to the metallic material of which the full-surface electrode 4n or 4p is formed. In the case where the n electrode 5 is formed by use of Ag, the contact resistance between the n-type semiconductor layer 31 and the n electrode 5 can be reduced. Therefore, it is further preferable that the n electrode 5 be formed by use of Ag.

In the case where each of the n electrode 5 and the p electrode 6 has a laminated structure, the lamination can be constituted by sublayers of Rh/Ag/Ni/W/Au/W/Ni/SiO$_2$ formed in this order from the bottom. The arrangement of a thin sublayer of Rh at the bottom sublayer can reduce the contact resistance at the boundary between the n electrode 5 and the n-type semiconductor layer 31 through the ITO film (as the full-surface electrode 4n) or at the boundary between the p electrode 6 and the p-type semiconductor layer 33 through the ITO film (as the full-surface electrode 4p), and prevents peel of the n electrode 5 and the p electrode 6 from the ITO films. Therefore, it is preferable to form a thin layer of Rh as the bottom sublayer of each of the n electrode 5 and the p electrode 6. However, even in the case where a thin layer of an alloy of Cr and Rh, instead of the thin layer of Rh, is formed as the bottom sublayer of each of the n electrode 5 and the p electrode 6, a similar effect to the case where the thin layer of Rh is formed as the bottom sublayer of each of the n electrode 5 and the p electrode 6. In addition, the adhesiveness of the n electrode 5 to the full-surface electrode 4n and the adhesiveness of the p electrode 6 to the full-surface electrode 4p can be increased by use of an intermediate sublayer W. Therefore, in order to prevent peel of the n electrode 5 and the p electrode 6, it is preferable to arrange an intermediate sublayer W between the n electrode 5 and the full-surface electrode 4n and between the p electrode 6 and the full-surface electrode 4p.

Further, in the case where a thin layer of Rh or an alloy of Cr and Rh is formed as the bottom sublayer in each of the n electrode 5 and the p electrode 6, it is preferable that the thickness of the bottom sublayer be 1 to 10 nm in order to achieve the effect of reducing the contact resistance and preventing the peel and take the advantage of the high reflectance of the Ag sublayer.

Furthermore, it is preferable to form a thin sublayer of $SiO_2$ as the uppermost sublayer in each of the n electrode 5 and the p electrode 6, since the arrangement of the thin sublayer of $SiO_2$ as the uppermost sublayer can prevent deterioration of the n electrode 5 and the p electrode 6 which can be caused by exposure of the exposed areas 5a and 6a to the outside air. Moreover, it is preferable to form, above the sublayer of Ag, a metal sublayer (e.g., a sublayer of Ni, W, or the like) which has a function of a barrier layer preventing migration and diffusion of Ag. Because the lower surface of the Ag sublayer in each of the n electrode 5 and the p electrode 6 is shielded by the full-surface electrode 4n or the full-surface electrode 4p, and the upper surface of the Ag sublayer is shielded by the above metal sublayer, and the side surfaces of the Ag sublayer are shielded by the insulation film 7, Ag migration can be prevented even after the production of the semiconductor light emitting device 1.

In the production method according to the embodiment (which is explained later), metal migration (which can generally occur during the production process) can be almost completely prevented. Therefore, even the metallic materials (such as Ag) which are likely to cause migration can be used as a material constituting the electrodes. In addition, since migration is unlikely to occur in the semiconductor light emitting device 1 produced by the production method according to the embodiment, the lifetime of the semiconductor light emitting device 1 increases.

Further, in the case where the emission wavelength of the semiconductor light emitting device 1 is short, the metallic materials other than Ag exhibits low reflectance and are likely to lower the emission efficiency. Therefore, the semiconductor light emitting device according to the embodiment, which allows use of Ag, is suitable as semiconductor light emitting devices having short emission wavelengths.

(Insulation Film (Barrier Layer))

The insulation film 7 is a barrier layer which is formed of an insulating material for preventing migration of the metallic material constituting the n electrode 5 and the p electrode 6 during the production process of the semiconductor light emitting device 1. After the production of the semiconductor light emitting device 1 is completed, the insulation film 7 functions as a protection film.

The insulation film 7 is preferably formed by atomic layer deposition (ALD). Since the insulating material is deposited on an atomic-layer basis in ALD, it is possible to form a uniform, closely-packed film. Therefore, ALD enables formation of a film suitable as the barrier layer (which is arranged for preventing migration of the metallic material constituting the n electrode 5 and the p electrode 6.

In addition, in the case where the light-output face is arranged on the semiconductor lamination 3 side, it is preferable that the insulation film 7 be formed of a material exhibiting high transparency at the emission wavelength.

Further, migration is more likely to occur in a moist environment. Therefore, it is preferable that the insulation film 7 be formed of a material exhibiting high barrier properties against moisture.

The insulation film 7 can be formed of a metal oxide such as Al, Hf, Zr, Ti, Ta, or La. Above all, it is particularly preferable to form the insulation film 7 of $Al_2O_3$, since $Al_2O_3$ exhibits superior barrier properties against moisture. The light-output efficiency increases with decrease in the thickness of the insulation film 7. In the case where the insulation film 7 is formed of $Al_2O_3$, a sufficient effect of preventing migration and sufficient light-output efficiency can be achieved when the insulation film 7 has a thickness of approximately 10 to 30 nm.

(Protection Film)

The protection film 8 is an insulative film covering the surface of the semiconductor light emitting device 1, and has the function of a protection film and the function of an antistatic film. The protection film 8 can be formed of an oxide such as Si, Ti, or Ta by using a known technique such as evaporation, sputtering, or the like. The thickness of the protection film 8 is preferably 100 nm or greater. For example, the protection film 8 may be a $SiO_2$ film having a thickness of approximately 250 nm. The entire surface of the semiconductor light emitting device 1 including the side surfaces of the step region 3a except the exposed areas 5a and 6a is coated with the protection film 8.

[Operation of Semiconductor Light Emitting Device]

The operations of the semiconductor light emitting device 1 according to the first embodiment shown in FIGS. 1A and 1B are explained below. In the following explanations, the semiconductor light emitting device 1 is assumed to be an LED of the face-up mount type, in which a reflection layer is arranged on the back surface of the substrate 2.

When electric current is supplied to the semiconductor light emitting device 1 through wiring (which is not shown and is, for example, bonding wires) connected to the n electrode 5 and the p electrode 6, the active layer 32 emits light. The light emitted from the active layer 32 propagates in the semiconductor lamination 3 and the substrate 2, and is externally outputted from the surface of the semiconductor lamination 3 through the full-surface electrodes 4n and 4p, the insulation film 7, and the protection film 8. The light which propagates in the semiconductor lamination 3 and reaches the back surfaces of the n electrode 5 and the p electrode 6 is reflected at the back surfaces of the n electrode 5 and the p electrode 6, and propagates downward. The light which propagates downward in the semiconductor light emitting device 1 is reflected by the reflection layer (not shown) arranged at the back surface of the substrate 2, propagates upward, and is externally outputted from the light-output face on the front side.

[Method for Producing Semiconductor Light Emitting Device]

Hereinbelow, the method for producing the semiconductor light emitting device according to the first embodiment of the present invention is explained with reference to FIG. 2.

Figure 2:
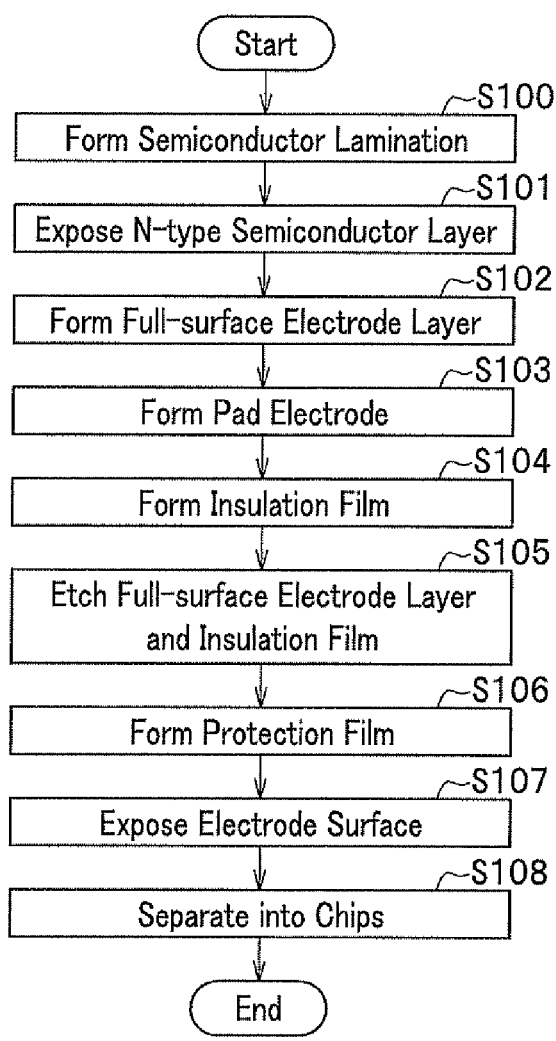
FIG. 2 is a flowchart indicating a flow of operations in a method for producing the semiconductor light emitting device according to the first embodiment.

As shown in FIG. 2, the method for producing the semiconductor light emitting device according to the first embodiment includes a lamination forming step S100 of forming the semiconductor lamination, a semiconductor-layer exposing step S101 of exposing the n-type semiconductor layer, a full-surface-electrode-layer forming step S102 of forming a full-surface electrode layer, a pad-electrode forming step S103 of forming the pad electrodes, an insulation-film forming step S104 of forming the insulation film, an etching step S105 of etching the full-surface electrode layer and the insulation film, a protection-film forming step S106 of forming the protection film, an electrode-surface exposing step S107 of exposing the electrode surfaces, and a chip separating step S108 of separating the processed substrate into chips. The operations in the above steps are performed in order of the step number.

The respective steps in the method for producing the semiconductor light emitting device according to the first embodiment are explained in detail below with reference to FIGS. 3A, 3B, 3C, 3D, 4A, 4B, 4C, 4D, and 5 (and FIGS. 1A, 1B, and 2 when necessary).

(Lamination Forming Step: S100)

Figure 3A:
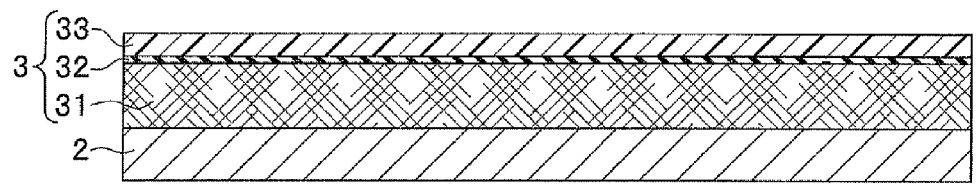
FIG. 3A is a schematic cross-sectional view of a layered structure formed in a step in an example of a production process of the semiconductor light emitting device according to the first embodiment, where a semiconductor lamination is formed in the step.

First, in the lamination forming step S100, the semiconductor lamination 3 is formed on the substrate 2 as shown in FIG. 3A. The lamination forming step S100 is explained in detail below.

First, semiconductor layers including GaN-based compound semiconductor layers realizing the n-type semiconductor layer 31, the active layer 32, and the p-type semiconductor layer 33 are grown on the substrate 2 of sapphire by MOCVD. Thereafter, preferably, the electric resistance of the p-type semiconductor layer 33 is lowered by annealing in a nitrogen atmosphere the substrate 2 on which the above semiconductor layers are formed. (Hereinafter, the substrate 2 processed in the respective steps before separation into chips are simply referred to as the wafer.)

(N-Type Semiconductor-Layer Exposing Step (First Semiconductor-Layer Exposing Step): S101)

Figure 3B:
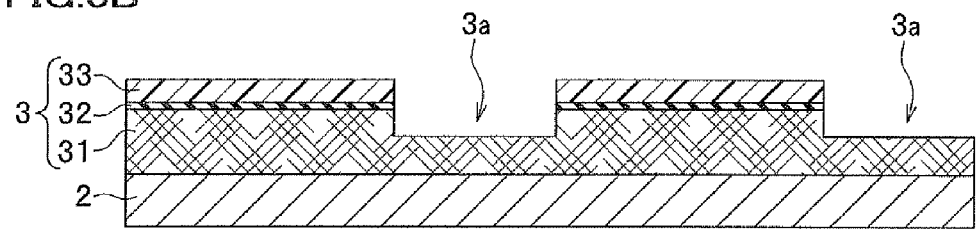
FIG. 3B is a schematic cross-sectional view of a layered structure formed in a step in the example of the production process according to the first embodiment, where an area of an n-type semiconductor layer is exposed in the step.

Next, in the n-type semiconductor-layer exposing step S101, the step region 3a (in which an area of the n-type semiconductor layer 31 is exposed) is formed for arranging the n electrode 5, as shown in FIG. 3B. Specifically, the step region 3a is formed as follows. That is, a mask having a predetermined shape is formed by using photoresist on the wafer after the annealing. Thereafter, the above area of the n-type semiconductor layer 31 is exposed by removing the p-type semiconductor layer 33, the active layer 32, and a part of the n-type semiconductor layer 31 over the above area by RIE (reactive ion etching). After the etching, the photoresist is removed.

On the substrate (wafer) 2 in the present embodiment, multiple unit regions in each of which the semiconductor light emitting device 1 is (being) formed are arrayed in a matrix arrangement. After the production of the semiconductor light emitting device 1 in each unit region is completed, the wafer is separated into chips. Although two step regions 3a formed for arranging the n electrode 5 are shown in FIG. 3B, each of the shown step regions 3a belongs to the semiconductor light emitting device 1 produced on a different one of the multiple unit regions.

(Full-Surface-Electrode-Layer Forming Step (Conductor Layer Forming Step): S102)

Figure 3C:
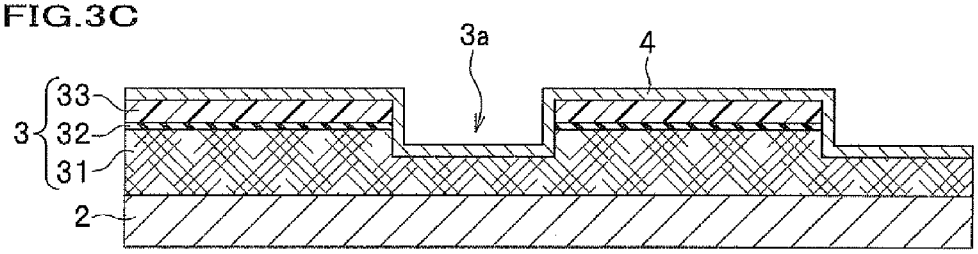
FIG. 3C is a schematic cross-sectional view of a layered structure formed in a step in the example of the production process according to the first embodiment, where a full-surface electrode layer is formed in the step.

Next, in the full-surface-electrode-layer forming step S102, a full-surface electrode layer (conductor layer) 4 of, for example, ITO is formed over the entire surface of the wafer by sputtering as shown in FIG. 3C. Since the full-surface electrode layer 4 makes a short circuit between the p-type semiconductor layer 33 and the part of the n-type semiconductor layer 31 which is exposed in the step region 3a (i.e., the full-surface electrode layer 4 electrically connects the p-type semiconductor layer 33 and the part of the n-type semiconductor layer 31), the potentials of the n-type semiconductor layer 31 and the p-type semiconductor layer 33 are equalized.

In the present embodiment, the above short-circuited condition produced by the full-surface electrode layer 4 between the n-type semiconductor layer 31 and the p-type semiconductor layer 33 is maintained until the pad-electrode forming step S103 and the insulation-film forming step S104 are completed. Therefore, it is possible to prevent migration of the metallic material constituting the n electrode 5 and the p electrode 6.

(Pad-Electrode Forming Step: S103)

Figure 3D:
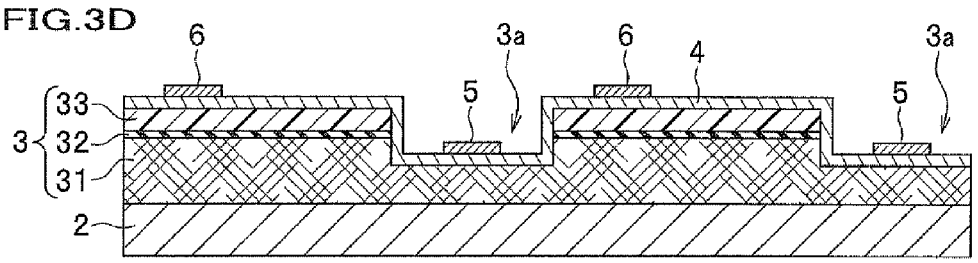
FIG. 3D is a schematic cross-sectional view of a layered structure formed in a step in the example of the production process according to the first embodiment, where pad electrodes are formed in the step.

Next, in the pad-electrode forming step S103, the n electrode 5 and the p electrode 6 are formed, by the lift-off technique, respectively on a first predetermined area on a first part of the full-surface electrode layer 4 formed above the step region 3a and on a second predetermined area on a second part of the full-surface electrode layer 4 formed on the upper surface of the p-type semiconductor layer 33, as shown in FIG. 3D.

The n electrode 5 and the p electrode 6 are formed of an identical metallic material as follows. That is, first, photoresist is applied to the entire surface of the wafer, and portions of the photoresist located on the first and second predetermined areas (on which the n electrode 5 and the p electrode 6 are to be formed) are removed. Subsequently, a metal film is formed over the entire surface of the wafer, and thereafter the portions of the metal film which are formed on the remaining portions of the photoresist are lifted off. Thus, the metal film remains only on the first and second predetermined areas (on which the n electrode 5 and the p electrode 6 are to be formed). That is, the formation of the n electrode 5 and the p electrode 6 is completed.

Generally, the lift-off process is performed in a moist environment, and therefore metal migration is likely to be promoted. The metal migration can occur when a potential difference (no electric field strength) exists. However, in the pad-electrode forming step S103 according to the present embodiment, the potential difference between the n-type semiconductor layer 31 and the p-type semiconductor layer 33 is removed by the full-surface electrode layer 4 formed before the pad-electrode forming step S103, i.e., no potential difference (no electric field strength) exists between the n-type semiconductor layer 31 and the p-type semiconductor layer 33. Therefore, in the process according to the present embodiment, migration can be almost completely prevented.

Although, in the present embodiment, the n electrode 5 and the p electrode 6 are respectively formed on the n-type semiconductor layer 31 and the p-type semiconductor layer 33 through the full-surface electrode layer 4, the n electrode 5 and the p electrode 6 may be connected to the corresponding semiconductor layers 31 and 33 in other manners. For example, one or both of the n electrode 5 and the p electrode 6 may be directly connected to the corresponding one or ones of the semiconductor layers 31 and 33.

(Insulation-Film Forming Step (Barrier Layer Forming Step): S104)

Figure 4A:
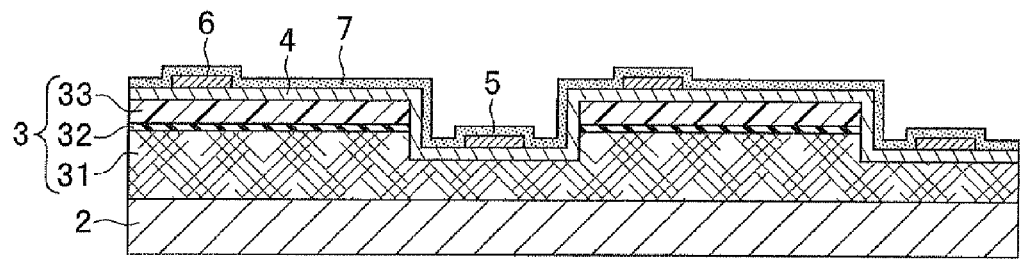
FIG. 4A is a schematic cross-sectional view of a layered structure formed in a step in the example of the production process according to the first embodiment, where an insulation film is formed in the step.

Next, in the insulation-film forming step S104, the insulation film 7 is formed over the entire surface of the wafer by ALD as shown in FIG. 4A.

Specifically, the insulation film 7 is formed as follows. For example, in the case where an $Al_2O_3$ film is formed as the insulation film 7, two different gases, TMA (trimethyl aluminum) and $H_2O$, can be used as source gases. The wafer is placed in a vacuum chamber (which is used as a reactor chamber), and a sequence of operations of supplying one of the two source gases in a pulsed manner, evacuating the remaining gas from the vacuum chamber, supplying the other of the two source gases in a pulsed manner, and evacuating the remaining gas from the vacuum chamber is repeated. The operations of evacuating the remaining gas from the vacuum chamber are performed for preventing mixing of the two source gases.

In each sequence of operations, one of the two source gases (the first raw material) supplied in a pulsed manner adheres to the surface of the wafer so as to form one layer of the atoms of the first raw material, and excessive source gas is evacuated from the vacuum chamber. Thereafter, the other of the two source gases (the second raw material) supplied in a pulsed manner couples with the first raw material in the layer formed on the wafer by the preceding supply operation, so that a layer of $Al_2O_3$ is formed on the wafer in the sequence of operations. Therefore, when the above sequence of operations is repeated, layers of $Al_2O_3$ are formed on a layer by layer basis. Consequently, a closely-packed film of $Al_2O_3$ having a uniform thickness and containing no pinhole is formed by ALD. Further, when a film is formed by ALD, step-like parts (at which the elevation changes) and vertical surfaces (such as the side surfaces of the step region 3a), as well as the horizontal surfaces (such as the upper surfaces of the n electrode 5 and the p electrode 6), are also coated well with the film. Therefore, the film formed by ALD in the insulation-film forming step S104 can have a superior function of the barrier layer which prevents migration of the metallic material.

The operations in the insulation-film forming step S104 are performed after the n electrode 5 and the p electrode 6 are formed in the pad-electrode forming step S103 before the connection part in the full-surface electrode layer 4 is removed in the etching step S105. Thus, even in the etching step S105 and following steps, migration of the material constituting the electrodes can be prevented.

(Full-Surface Electrode Layer/Insulation-Film Etching Step (Connection Part Removing Step): S105)

Figure 4B:
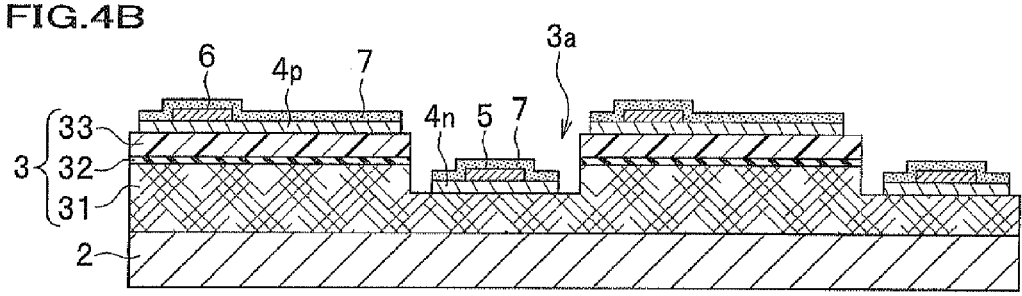
FIG. 4B is a schematic cross-sectional view of a layered structure formed in a step in the example of the production process according to the first embodiment, where portions of the full-surface electrode layer and the insulation film are etched in the step.

Next, in the etching step S105, the portions of the full-surface electrode layer 4 formed on the side surfaces of the step region 3a (which realize the short circuit between the n-type semiconductor layer 31 and the p-type semiconductor layer 33), peripheral areas of the bottom surface of the step region 3a in vicinities of the side surfaces, and peripheral areas of the upper surfaces of the p-type semiconductor layer 33, together with the portions of the insulation film 7 formed on the above portions of the full-surface electrode layer 4, are removed by etching as shown in FIG. 4B. Thus, the full-surface electrode 4n and the full-surface electrode 4p are electrically separated.

Specifically, the operations in the etching step S105 are performed as follows.

That is, first, photoresist is applied to the entire surface of the wafer, and an etching mask is formed by removing portions of the photoresist located on the side surfaces of the step region 3a, the peripheral areas of the bottom surface of the step region 3a in the vicinities of the side surfaces, and the peripheral areas of the upper surfaces of the p-type semiconductor layer 33. Thereafter, the portions of the $Al_2O_3$ film (as the insulation film 7) which are not covered by the etching mask are removed by etching. Subsequently, the portions of the ITO film (as the full-surface electrode layer 4) which are not covered by the etching mask are removed by etching using the same etching mask.

Since the portions of the full-surface electrode layer 4 and the portions of the insulation film 7 are removed by using the same etching mask, the full-surface electrodes 4n and 4p (as the remaining portions of the full-surface electrode layer 4) and the remaining portions of the insulation film 7 have approximately identical shapes in plan view. In addition, since the insulation film 7 is subject to patterning with the same shape (in plan view) as the full-surface electrodes 4n and 4p, it is possible to achieve satisfactory barrier properties, and therefore effectively prevent migration the metallic material constituting the n electrode 5 and the p electrode 6, which are covered by the insulation film 7 and the full-surface electrodes 4n and 4p.

In this specification, when the position differences between the edges of the remaining portions of the insulation film 7 and the corresponding edges of the full-surface electrodes 4n and 4p are 2 micrometers or smaller, the remaining portions of the insulation film 7 and the full-surface electrodes 4n and 4p are regarded as having approximately identical shapes in plan view. That is, in the etching step S105, the insulation film 7 is required to cover only the areas extending to vicinities of the edges of the upper surfaces of the full-surface electrodes 4n and 4p which are exposed out of the n electrode 5 and the p electrode 6.

(Protection-Film Forming Step: S106)

Figure 4C:
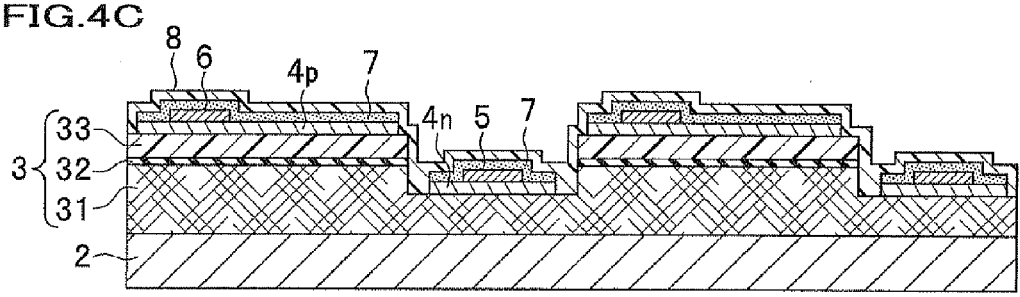
FIG. 4C is a schematic cross-sectional view of a layered structure formed in a step in the example of the production process according to the first embodiment, where a protection film is formed in the step.

Next, in the protection-film forming step S106, the protection film 8 is formed over the entire surface of the wafer as shown in FIG. 4C. For example, a film of $SiO_2$ may be formed as the protection film 8 by sputtering or the like.

In the present embodiment, the n electrode 5 and the p electrode 6 are shielded by the insulation film 7 and the full-surface electrodes 4n and 4p. Therefore, even in the steps after the connection part in the full-surface electrode layer 4 (which equalizes the potentials of the n-type semiconductor layer 31 and the p-type semiconductor layer 33) is removed, migration of the metallic material constituting the electrodes can be prevented.

As explained above, the protection film 8 is formed after the ITO film arranged on the side surfaces of the step region 3a (which realize the connection part in the full-surface electrode layer 4) is removed. Therefore, it is possible to form the protection film 8 so as to cover the side surfaces of the step region 3a as well as the upper surface of the semiconductor light emitting device 1.

(Electrode-Surface Exposing Step: S107)

Figure 4D:
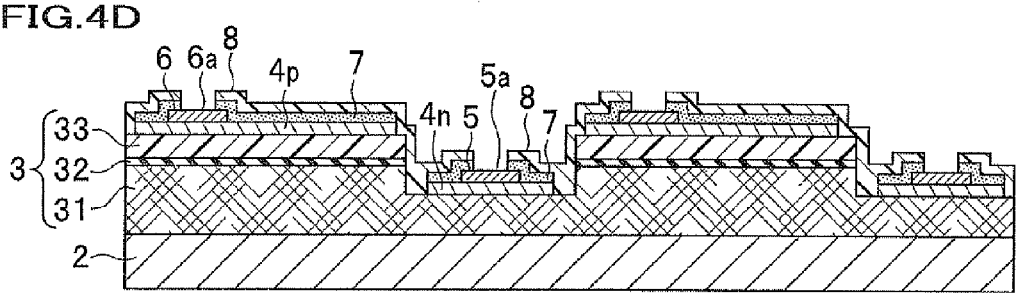
FIG. 4D is a schematic cross-sectional view of a layered structure formed in a step in the example of the production process according to the first embodiment, where areas of the electrode surface are exposed in the step.

Next, in the electrode-surface exposing step S107, portions of the insulation film 7 and the protection film 8 which are formed on the areas 5a and 6a of the n electrode 5 and the p electrode 6 are removed as shown in FIG. 4D. Thus, the exposed areas 5a and 6a are produced for the aforementioned connection to the external electrodes arranged outside the n electrode 5 and the p electrode 6 for wiring.

Specifically, the operations in the protection-film forming step S106 are performed as follows.

That is, first, photoresist is applied to the entire surface of the wafer, and an etching mask is formed by removing, by photolithography, portions of the photoresist located on the areas 5a and 6a which are to be exposed. Thereafter, the portions of the $Al_2O_3$ film (as the insulation film 7) and the corresponding portions of the $SiO_2$ film (as the protection film 8) which are not covered by the etching mask are removed by etching. Even in the case where the insulation film 7 or the protection film 8 is formed of a material other than Al₂O₃ or SiO₂, etching as above can be performed in a similar manner by using an appropriately selected etchant solution.

(Chip Separating Step: S108)

Figure 5:
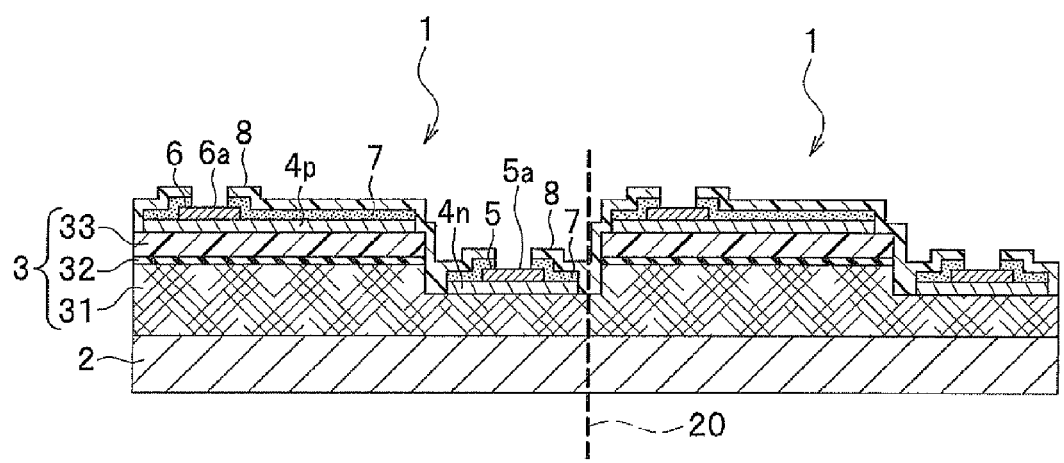
FIG. 5 is a schematic cross-sectional view of a layered structure formed by the example of the production process according to the first embodiment, where a position at which the layered structure is cut for separation into chips of semiconductor light emitting devices is indicated.

Finally, in the chip separating step S108, the multiple semiconductor light emitting devices 1 formed on the aforementioned multiple unit regions arrayed in the matrix arrangement on the substrate (wafer) 2 are separated into chips by scribing, dicing, or the like as shown in FIG. 5. Thus, production of the semiconductor light emitting devices 1 in the chips is completed. In addition, the thickness of the substrate 2 may be reduced to a desired thickness by performing back grinding of the substrate 2 before the separation into the chips.

Further, in the case where the semiconductor light emitting device 1 is the face-up mount type (in which the light-output face is on the semiconductor lamination 3 side), a reflection layer realized by a multilayer dielectric film or a metal film exhibiting high reflectance (such as a film of Ag or Al) may be formed on the back side of the substrate 2 before or after the chip separating step S108.

As explained above, according to the first embodiment, the potential difference between the n-type semiconductor layer 31 and the p-type semiconductor layer 33 is removed by making a short circuit between the n-type semiconductor layer 31 and the p-type semiconductor layer 33, and thereafter the n electrode 5 and the p electrode 6 are formed. Further, the n electrode 5 and the p electrode 6 are coated with the insulation film 7, and thereafter the full-surface electrode layer 4 is etched so as to split the full-surface electrode layer 4 into the full-surface electrodes 4n and 4p. Therefore, migration of the metallic material constituting the n electrode 5 and the p electrode 6 can be prevented during the production process.

Further, according to the first embodiment, even in the case where Ag (which is generally likely to cause migration and is difficult to use) is used, the n electrode 5 and the p electrode 6 can be formed without causing migration.

Furthermore, since Ag exhibits high electric conductivity and high reflectance of light, in particular, at short wavelengths, according to the first embodiment, it is possible to increase the light-output efficiency in the semiconductor light emitting device emitting light having short wavelengths such as blue light.

<Modification of First Embodiment>

Figure 6:
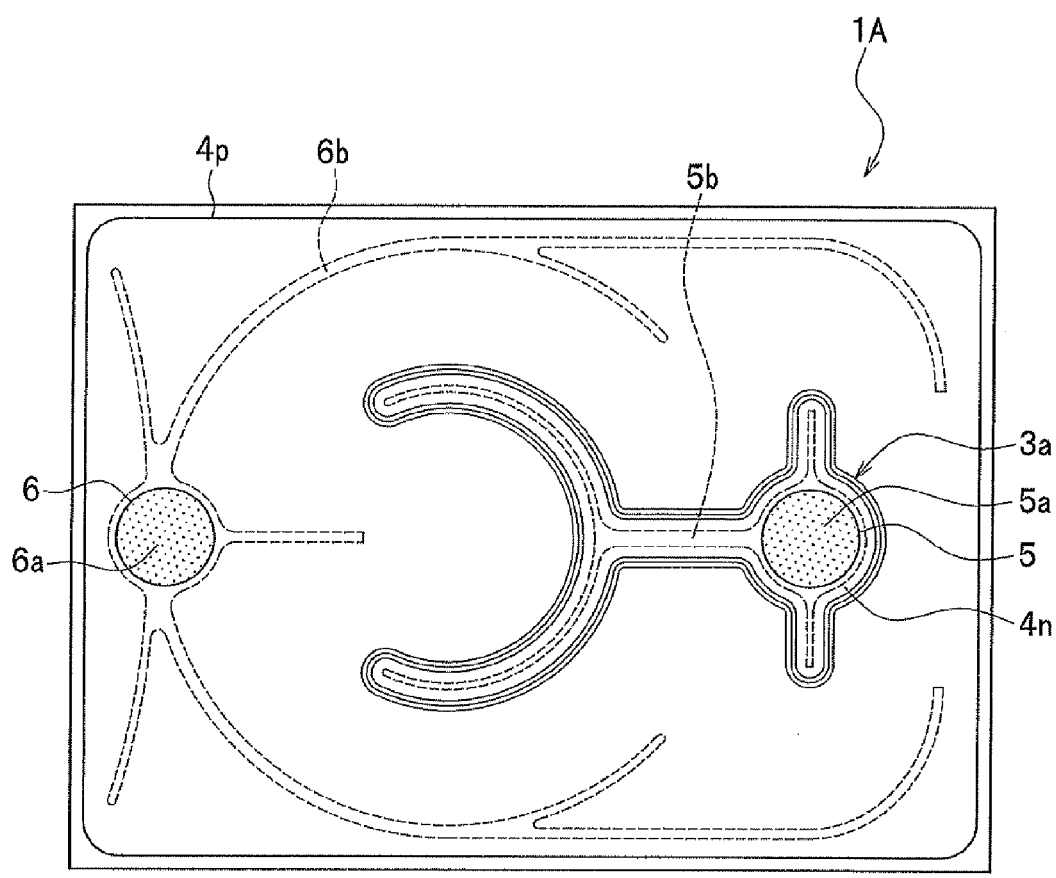
FIG. 6 is a schematic plan view of a semiconductor light emitting device as a modification of the first embodiment of the present invention.

A semiconductor light emitting device as a modification of the first embodiment is explained below with reference to FIG. 6. FIG. 6 is a schematic plan view of the semiconductor light emitting device 1A as the modification of the first embodiment. In FIG. 6 showing the modification of the first embodiment, constituent elements identical or corresponding to the constituent elements of the semiconductor light emitting device 1 according to the first embodiment bear the same reference numbers as the first embodiment, and the same explanations as the first embodiment are not repeated below.

As shown in FIG. 6, the semiconductor light emitting device 1A as the modification of the first embodiment is different from the semiconductor light emitting device 1 as the first embodiment in the shapes in plan view of the step region 3a, the n electrode 5, and the p electrode 6.

In the modification shown in FIG. 6, the step region 3a is not arranged in contact with the outer edge of the semiconductor light emitting device 1A. That is, the step region 3a is surrounded by the p-type semiconductor layer 33 in every direction (see FIGS. 1A and 1B). In addition, as shown in FIG. 6, the step region 3a in the semiconductor light emitting device 1A has a shape, in plan view, extending from the position of the exposed area 5a and having branches. (As explained before, the exposed area 5a is arranged for connection between the n electrode 5 and the external electrodes on the mount board.)

Further, the full-surface electrode 4n is formed on approximately the entire bottom surface of the step region 3a.

Furthermore, the n electrode 5 is formed, on the full-surface electrode 4n, in a shape corresponding to the above-mentioned shape of the step region 3a. Therefore, the n electrode 5 has an extension 5b with a shape extending along the step region 3a and having branches.

The surfaces of the full-surface electrode 4n and the n electrode 5 except the exposed area 5a are coated with the insulation film 7.

In addition to the above, the full-surface electrode 4p is formed over approximately the entire upper surface of the p-type semiconductor layer 33 (see FIG. 1B).

Further, the p electrode 6 having an extension 6b is formed on the full-surface electrode 4p, and the extension 6b has a shape, in plan view, branching from the exposed area 6a and extending so as to almost surround the step region 3a.

Furthermore, the surfaces of the full-surface electrode 4p and the p electrode 6 except the exposed area 6a are coated with the insulation film 7, and the entire surface of the semiconductor light emitting device 1A except the exposed areas 5a and 6a is coated with the protection film 8. (The protection film 8 is not shown in FIG. 6.)

Although the semiconductor light emitting device 1A as the present modification is different from the semiconductor light emitting device 1 according to the first embodiment in the shapes in plan view of the step region 3a, the n electrode 5, and the p electrode 6 as explained above, the semiconductor light emitting device 1A operate in a similar manner to the semiconductor light emitting device 1, and can be produced in a similar manner to the semiconductor light emitting device 1. Therefore, explanations on the operations and the production process of the semiconductor light emitting device 1A as the present modification are not presented.

Although the single n electrode 5 and the single p electrode 6 are arranged in the structures according to the first embodiment or the modification of the first embodiment, alternatively, it is possible to arrange more than one n electrode and/or more than one p electrode. In addition, the step region 3a may have an arbitrary shape in plan view.

The modifications in the step region 3a, the n electrode 5, and the p electrode 6 explained above can also be applied to the semiconductor light emitting device 1B according to the second embodiment, which is explained later with reference to FIGS. 7A to 10B.

Second Embodiment

Structure of Semiconductor Light Emitting Device

Figure 7A:
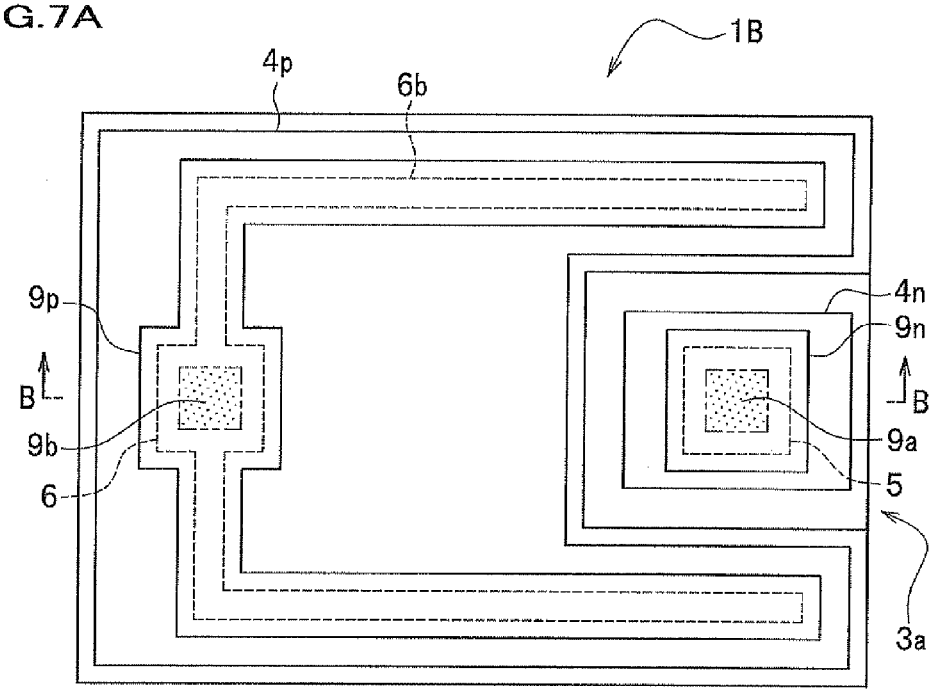
FIG. 7A is a schematic plan view of a semiconductor light emitting device according to a second embodiment of the present invention.

The structure of the semiconductor light emitting device according to the second embodiment is explained below with reference to FIGS. 7A and 7B. FIG. 7A is a schematic plan view of the semiconductor light emitting device according to the second embodiment of the present invention, and FIG. 7B is a schematic cross-sectional view of the semiconductor light emitting device of FIG. 7A at the B-B cross section indicated in FIG. 7A.

Figure 7B:
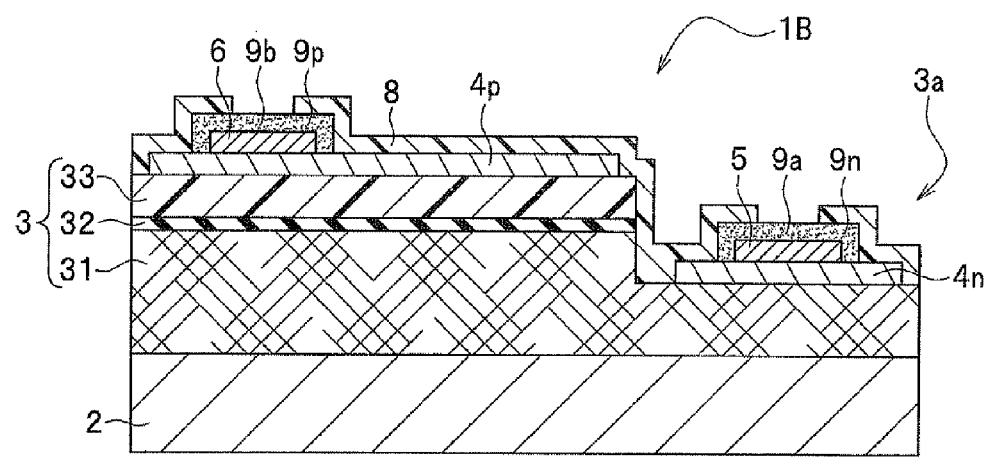
FIG. 7B is a schematic cross-sectional view of the semiconductor light emitting device of FIG. 7A at the B-B cross section indicated in FIG. 7A.

The semiconductor light emitting device 1B according to the second embodiment shown in FIGS. 7A and 7B is different from the semiconductor light emitting device 1 according to the first embodiment shown in FIGS. 1A and 1B in that the semiconductor light emitting device 1B includes cover electrodes 9n and 9p instead of the insulation film 7. In FIGS. 7A to 10B showing the second embodiment, constituent elements identical or corresponding to the constituent elements of the semiconductor light emitting device 1 according to the first embodiment bear the same reference numbers as the first embodiment, and the same explanations as the first embodiment are not repeated below.

As shown in FIGS. 7A and 7B, in the semiconductor light emitting device 1B according to the second embodiment, the cover electrode 9n is arranged to cover the upper surface and side surfaces of the n electrode 5, and the cover electrode 9p is arranged to cover the upper surface and side surfaces of the p electrode 6. That is, the n electrode 5 and the p electrode 6 are shielded by the full-surface electrodes 4n and 4p and the cover electrodes 9n and 9p.

The cover electrodes 9n and 9p are formed of metallic material and have electric conductivity. The upper surfaces of the cover electrodes 9n and 9p respectively have exposed areas 9a and 9b, which are arranged for connection to the aforementioned electrodes on the mount board for wiring. The exposed area 9a is an area of the cover electrode 9n exposed out of the protection film 8, and the exposed area 9b is an area of the cover electrode 9p exposed out of the protection film 8. (The protection film 8 is not shown in FIG. 7A.)
(Cover Electrode (Barrier Layer))

The cover electrodes 9n and 9p are metal layers having a function of a barrier layer for preventing migration of the metallic material constituting the n electrode 5 and the p electrode 6. The cover electrodes 9n and 9p are formed of metal which is less likely to cause migration than the metallic material constituting the n electrode 5 and the p electrode 6. For example, the cover electrodes 9n and 9p can be formed of a non-alloy or an alloy of Pt, Rh, Ru, Ti, Ni, Au, Al, Si, and Cu. In order to secure sufficient barrier properties and reduce the wire resistance, it is preferable that each of the cover electrodes 9n and 9p have a thickness of approximately 500 nm or greater.

[Operation of Semiconductor Light Emitting Device]

The operations of the semiconductor light emitting device 1B according to the second embodiment shown in FIGS. 7A and 7B are explained below. In the following explanations, the semiconductor light emitting device 1B is assumed to be an LED of the face-up mount type, in which a reflection layer is arranged on the back surface of the substrate 2.

When electric current is supplied to the semiconductor light emitting device 1B through wiring (which is not shown and is, for example, bonding wires) connected to the n electrode 5 and the p electrode 6, the active layer 32 emits light. The light emitted from the active layer 32 propagates in the semiconductor lamination 3 and the substrate 2, and is externally outputted from the surface of the semiconductor lamination 3 through the full-surface electrodes 4n and 4p and the protection film 8. The light which propagates in the semiconductor lamination 3 and reaches the back surfaces of the n electrode 5 and the p electrode 6 is reflected at the back surfaces of the n electrode 5 and the p electrode 6, and propagates downward. The light which propagates downward in the semiconductor light emitting device 1B is reflected by the reflection layer (not shown) arranged at the back surface of the substrate 2, propagates upward, and is externally outputted from the light-output face on the front side.

[Method for Producing Semiconductor Light Emitting Device]

Hereinbelow, the method for producing the semiconductor light emitting device 1B according to the second embodiment of the present invention is explained with reference to FIG. 8.

Figure 8:
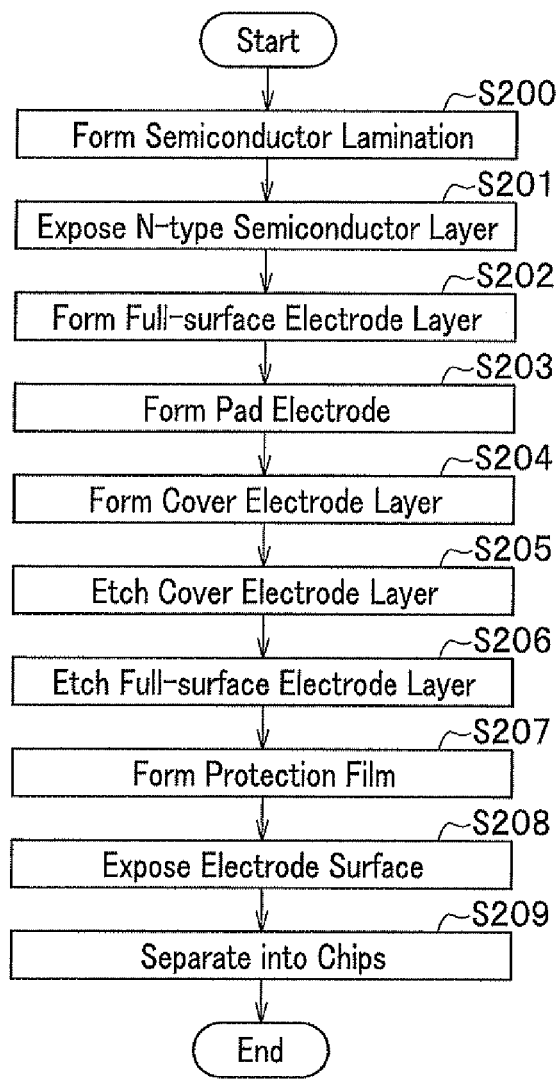
FIG. 8 is a flowchart indicating a flow of operations in a method for producing the semiconductor light emitting device according to the second embodiment.

As shown in FIG. 8, the method for producing the semiconductor light emitting device according to the second embodiment includes a lamination forming step S200 of forming the semiconductor lamination, a semiconductor-layer exposing step S201 of exposing the n-type semiconductor layer, a full-surface-electrode-layer forming step S202 of forming the full-surface electrode layer, a pad-electrode forming step S203 of forming the pad electrodes, a cover-electrode-layer forming step S204 of forming a cover-electrode layer, a cover-electrode etching step S205 of etching the cover-electrode layer, a full-surface-electrode-layer etching step S206 of etching the full-surface electrode layer, a protection-film forming step S207 of forming the protection film, an electrode-surface exposing step S208 of exposing the electrode surfaces, and a chip separating step S209 of separating the processed substrate into chips. The operations in the above steps are performed in order of the step number.

The lamination forming step S200, the semiconductor-layer exposing step S201, the full-surface-electrode-layer forming step S202, and the pad-electrode forming step S203 in the method according to the second embodiment indicated in FIG. 8 respectively correspond to the lamination forming step S100, the semiconductor-layer exposing step S101, the full-surface-electrode-layer forming step S102 and the pad-electrode forming step S103 in the method according to the first embodiment indicated in FIG. 2. Therefore, the explanations on the above steps S200 to S203 are not repeated.

The cover-electrode-layer forming step S204 and following steps in the method for producing the semiconductor light emitting device 1B according to the second embodiment are explained in detail below with reference to FIGS. 9A, 9B, 9C, 9D, 10A, and 10B (and FIGS. 7A, 7B, and 8 when necessary).
(Cover-Electrode-Layer Forming Step (Barrier Layer Forming Step): S204)

Figure 9A:
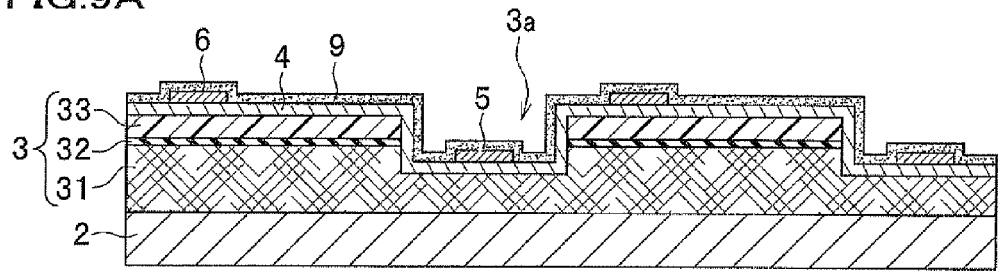
FIG. 9A is a schematic cross-sectional view of a layered structure formed in a step in an example of a production process of the semiconductor light emitting device according to the second embodiment, where a cover electrode layer is formed in the step.

After the n electrode 5 and the p electrode 6 are formed in the pad-electrode forming step S203 (as shown in FIG. 3D), a cover-electrode layer 9 is formed on the entire surface of the wafer in the cover-electrode-layer forming step S204 as shown in FIG. 9A. The cover-electrode layer 9 can be formed by ALD, sputtering, or the like.
(Cover-Electrode Forming Step S205)

Figure 9B:
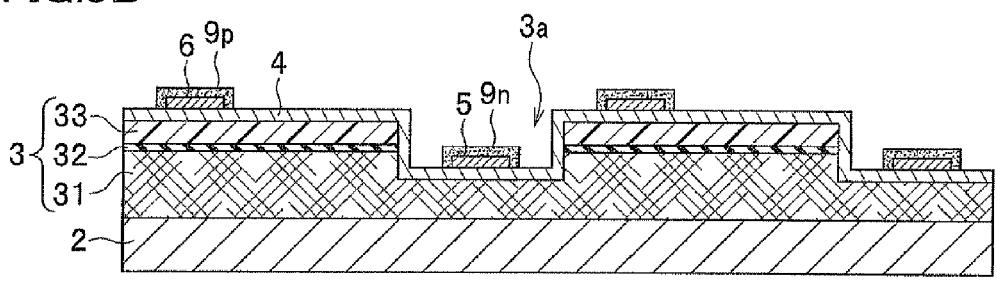
FIG. 9B is a schematic cross-sectional view of a layered structure formed in a step in the example of the production process according to the second embodiment, where portions of the cover electrode layer are removed in the step.

Next, in the cover-electrode forming step S205, the cover-electrode layer 9 other than the portions of the cover-electrode layer 9 covering the upper surfaces and side surfaces of the n electrode 5 and the p electrode 6 is removed by wet etching as shown in FIG. 9B.

Specifically, the operations in the cover-electrode forming step S205 are as follows. That is, first, photoresist is applied to the entire surface of the wafer, and an etching mask is formed by removing, by photolithography, the photoresist other than the portions of the photoresist covering the upper surfaces and side surfaces of the n electrode 5 and the p electrode 6. Thereafter, the portions of the cover-electrode layer 9 which are not covered by the etching mask are removed by etching using an etchant solution corresponding to the metallic material constituting the cover-electrode layer 9.

In the operation in the cover-electrode forming step S205, it is preferable to remove the portions of the cover-electrode layer 9 covering the side surfaces of the n electrode 5 and the p electrode 6 as much as possible within such a limit that barrier properties needed for preventing migration of the metallic material which constitutes the n electrode 5 and the p electrode 6 can be secured. Such removal of the portions of the cover-electrode layer 9 covering the side surfaces of the n electrode 5 and the p electrode 6 can reduce light absorption by excessively formed portions of the cover-electrode layer 9, and can resultantly increase the light-output efficiency in the semiconductor light emitting device 1B.

(Full-Surface-Electrode-Layer Etching Step (Connection Part Removing Step): S206)

Figure 9C:
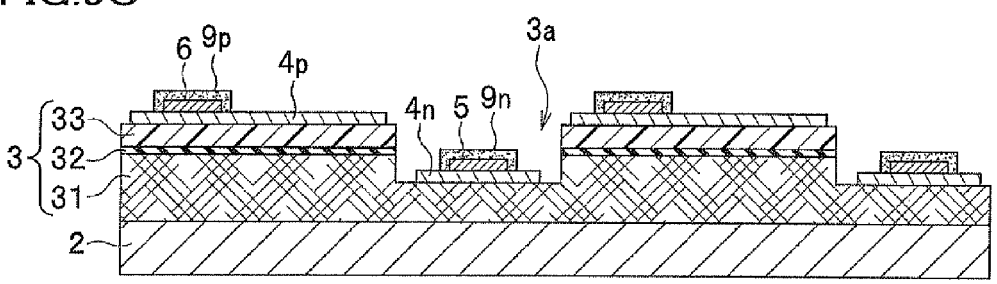
FIG. 9C is a schematic cross-sectional view of a layered structure formed in a step in the example of the production process according to the second embodiment, where portions of the full-surface electrode layer are etched in the step.

Next, in the full-surface-electrode-layer etching step S206, the portions of the full-surface electrode layer 4 formed on the side surfaces of the step region 3a, peripheral areas of the bottom surface of the step region 3a in vicinities of the side surfaces, and peripheral areas of the upper surfaces of the p-type semiconductor layer 33 are removed by wet etching as shown in FIG. 9C. (As mentioned before, the step region 3a is arranged for realizing a short circuit between the n-type semiconductor layer 31 and the p-type semiconductor layer 33.) Thus, the full-surface electrodes 4n and 4p are electrically separated from each other.

Specifically, the operations in the full-surface-electrode-layer etching step S206 are as follows. That is, first, photoresist is applied to the entire surface of the wafer, and an etching mask is formed by removing, by photolithography, the photoresist located on the side surfaces of the step region 3a, the peripheral areas of the bottom surface of the step region 3a in the vicinities of the side surfaces, and peripheral areas of the upper surfaces of the p-type semiconductor layer 33. Thereafter, the portions of the full-surface electrode layer 4 (ITO film) which are not covered by the etching mask are removed by etching.

(Protection-Film Forming Step: S207)

Figure 9D:
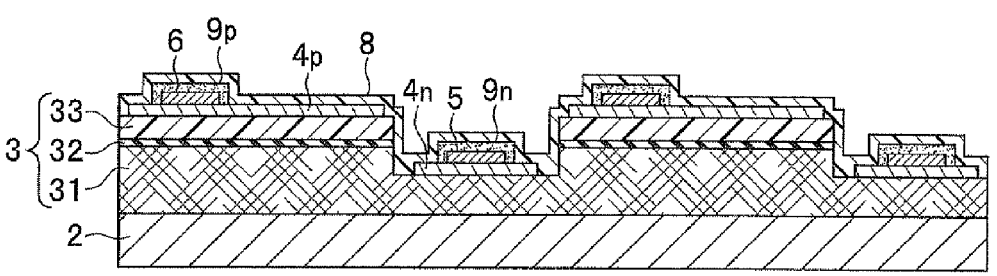
FIG. 9D is a schematic cross-sectional view of a layered structure formed in a step in the example of the production process according to the second embodiment, where a protection film is formed in the step.

Next, in the protection-film forming step S207, the protection film 8 is formed over the entire surface of the wafer as shown in FIG. 9D. For example, an $SiO_2$ film can be formed as the protection film 8 by sputtering or the like.

(Electrode-Surface Exposing Step: S208)

Figure 10A:
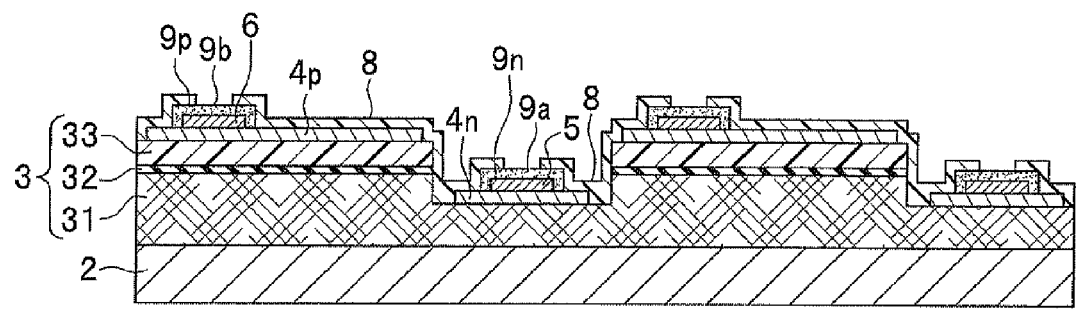
FIG. 10A is a schematic cross-sectional view of a layered structure formed in a step in the example of the production process according to the second embodiment, where electrode surfaces are exposed in the step.

Next, in the electrode-surface exposing step S208, portions of the protection film 8 which are formed on the areas 9a and 9a of the cover electrodes 9n and 9p are removed as shown in FIG. 10A. Thus, the exposed areas 9a and 9a are produced for the aforementioned connection to the external electrodes arranged outside the n electrode 5 and the p electrode 6 for wiring. Since the operations in the electrode-surface exposing step S208 can be performed in a similar manner to the operation in the electrode-surface exposing step S107 in FIG. 2, the detailed explanations of the operations in the electrode-surface exposing step S208 are not presented.

(Chip Separating Step: S209)

Figure 10B:
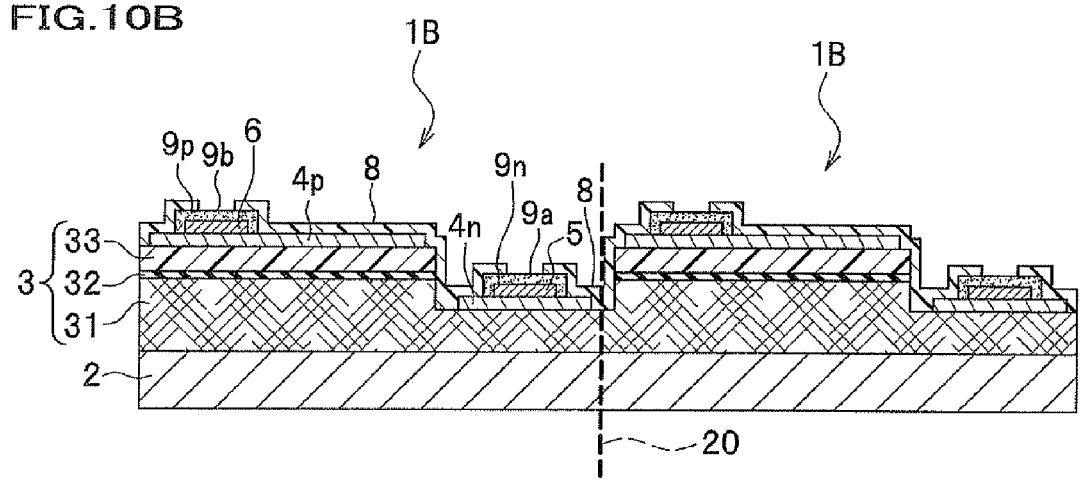
FIG. 10B is a schematic cross-sectional view of a layered structure formed by the example of the production process according to the second embodiment, where a position at which the layered structure is cut for separation into chips of semiconductor light emitting devices is indicated

Finally, in the chip separating step S209, the multiple semiconductor light emitting devices 1B formed on the aforementioned multiple unit regions arrayed in the matrix arrangement on the substrate (wafer) 2 are separated into chips by scribing, dicing, or the like as shown in FIG. 10B. Thus, production of the semiconductor light emitting devices 1B in the chips is completed. In addition, the thickness of the substrate 2 may be reduced to a desired thickness by performing back grinding of the substrate 2 before the separation into the chips.

Further, in the case where the semiconductor light emitting device 1B is the face-up mount type (in which the light-output face is on the semiconductor lamination 3 side), a reflection layer realized by a multilayer dielectric film or a metal film exhibiting high reflectance (such as a film of Ag or Al) may be formed on the back side of the substrate 2 before or after the chip separating step S209.

As explained above, according to the second embodiment, the potential difference between the n-type semiconductor layer 31 and the p-type semiconductor layer 33 is removed by making a short circuit between the n-type semiconductor layer 31 and the p-type semiconductor layer 33, and thereafter the n electrode 5 and the p electrode 6 are formed. Further, the n electrode 5 and the p electrode 6 are coated with the cover-electrode layer 9, and thereafter the full-surface electrode layer 4 is etched so as to split the full-surface electrode layer 4 into the full-surface electrodes 4n and 4p. Therefore, migration of the metallic material constituting the n electrode 5 and the p electrode 6 can be prevented during the production process.

Further, according to the second embodiment, even in the case where Ag (which is generally likely to cause migration and is difficult to use) is used, the n electrode 5 and the p electrode 6 can be formed without causing migration.

Furthermore, since Ag exhibits high electric conductivity and high reflectance of light, in particular, at short wavelengths, according to the second embodiment, it is possible to increase the light-output efficiency in the semiconductor light emitting device emitting light having short wavelengths such as blue light.

Concrete Example

A concrete example of a semiconductor light emitting device as the aforementioned modification of the first embodiment shown in FIG. 6 in which n electrode 5 and the p electrode 6 are formed by use of Ag (which is hereinafter referred to as Sample 1) has been produced, and a semiconductor light emitting device in which no Ag is used (which is hereinafter referred to as Sample 2) has also been produced as a comparison example. Then, comparison of the emission power has been made as explained below.

Sample 1 has been produced as follows.

First, a semiconductor lamination is produced by forming an n-type semiconductor layer, an active layer, and a p-type semiconductor layer on a sapphire substrate, where the n-type semiconductor layer, the active layer, and the p-type semiconductor layer are GaN-based compound semiconductors.

Thereafter, a step region in which the p-type semiconductor layer and the active layer are removed and the n-type semiconductor layer is exposed is produced in the semiconductor lamination by removing the p-type semiconductor layer and the active layer in a region of the semiconductor lamination by RIE.

Next, an ITO film (having the thickness of 170 nm) as a full-surface electrode layer is formed over the entire surface of the semiconductor lamination by sputtering, so that a short circuit is made between the n-type semiconductor layer and the p-type semiconductor layer.

Subsequently, a photoresist mask having openings in the areas in which the n electrode and the p electrode are respectively to be formed is formed over the entire surface of the full-surface electrode while the short circuit between the n-type semiconductor layer and the p-type semiconductor layer is maintained. Then, a multilayer film of sublayers Rh/Ag/Ni/W/Au/W/Ni/$SiO_2$ (=1/100/100/100/500/30/6/30 [nm]) is formed in this order by sputtering, where the bottom sublayer is Rh. Thereafter, the photoresist mask is removed, so that the production of the n electrode and the p electrode is completed.

Next, the entire surface of the wafer is coated with an $Al_2O_3$ film (having the thickness of 10 nm) by ALD, where the $Al_2O_3$ film is the insulation film (barrier layer) for preventing migration of Ag, which is the material constituting the electrodes.

Subsequently, the ITO film (the full-surface electrode layer) and the $Al_2O_3$ film (the insulation film) are etched by using an identical etching mask, so that the connection part connecting the n electrode and the p electrode is removed, i.e., the n electrode and the p electrode are electrically separated. Thereafter, the entire surface of the wafer is coated with an $SiO_2$ film (having a thickness of 220 nm) as a protection film by sputtering.

Next, the protection film and the barrier layer are etched so as to expose the areas 5a and 6a of the upper surface of the n electrode 5 and the p electrode 6 for wire bonding.

Finally, the wafer is divided by dicing into chips on each of which the semiconductor laser element as Sample 1 is formed.

Sample 2 as the comparison example has been produced as follows.

The production process of Sample 2 is different from the production process of Sample 1 only in that the n electrode and the p electrode are realized by a multilayer metal film of sublayers of Rh/W/Au (=100/50/500 [nm]), and the insulation film (barrier layer) is not formed, and an $SiO_2$ film as a protection film is formed by sputtering.

The emission powers Po of Sample 1 and Sample 2 are shown below. Each of Sample 1 and Sample 2 has the dimensions of 750 [μm]×550 [μm], and electric current of 100 [mA] is supplied between the n and p electrodes. Three samples have been produced by using three different production systems for each of Sample 1 and Sample 2, and the average of the values of the emission power measured in the three samples for each of Sample 1 and Sample 2 has been finally obtained as the emission power Po for comparison. Although each of Sample 1 and Sample 2 emits light in the wavelength range of 456.5 to 458.8 [nm], the measured emission power has been corrected to a value of emission power at the wavelength of 455 nm and the average of the corrected values has been calculated.

The emission power Po of Sample 1 finally obtained as above has been 180.5 [mW], while the emission power Po of Sample 2 finally obtained as above has been 177.5 [mW]. That is, the above measurement indicates that the use of Ag in the electrodes in the semiconductor light emitting devices according to the embodiment increases the emission power by approximately 1.7%. (Ag exhibits high reflectance at the emission wavelength of approximately 455 [nm].)

In addition, no migration has been observed in the samples produced for Sample 1 and Sample 2.

What is claimed is:

1. A method for producing a semiconductor light emitting device, comprising:
    a lamination forming step of forming a semiconductor lamination by successively stacking a first semiconductor layer and a second semiconductor layer on a substrate, where the first semiconductor layer and the second semiconductor layer respectively have different conductive types;
    an exposing step of removing a portion of the semiconductor lamination so as to form a step region having a bottom surface at which the first semiconductor layer is exposed;
    a conductor layer forming step of forming a conductor layer which connects the first semiconductor layer and the second semiconductor layer;
    an electrode forming step of forming a first electrode on the bottom surface of the step region at which the first semiconductor layer is exposed, and forming a second electrode on an upper surface of the second semiconductor layer;
    a barrier layer forming step of forming a barrier layer which covers at least one of the first electrode and the second electrode; and
    a connection part removing step of removing a connection part in the conductor layer which connects the first semiconductor layer and the second semiconductor layer,
    wherein the exposing step is performed after the lamination forming step, the conductor layer forming step is performed after the exposing step, the electrode forming step is performed after the conductor layer forming step, the barrier layer forming step is performed after the electrode forming step, and the connection part removing step is performed after the barrier layer forming step.

2. The method according to claim 1, wherein the second electrode is formed on the second semiconductor layer through the conductor layer.

3. The method according to claim 1, wherein the first electrode is formed over the exposed surface of the first semiconductor layer through the conductor layer.

4. The method according to claim 1, wherein at least one of the first electrode and the second electrode contains Ag or Ag alloy.

5. The method according to claim 1, wherein a film of metal oxide is formed as the barrier layer by atomic layer deposition.

6. The method according to claim 5, wherein the metal oxide is $Al_2O_3$.

7. The method according to claim 1, wherein the barrier layer covering at least one of the first electrode and the second electrode is formed of a metal or an alloy which is different from a metal or an alloy of which the first or second electrode is formed.

8. The method according to claim 1, wherein the conductor layer contains as a main component an oxide constituted by at least one of Zn, In, Sn, Ga, and Ti.

9. The method according to claim 1, wherein the conductor layer is transparent at a wavelength of light emitted by the semiconductor light emitting device.

10. The method according to claim 1, further comprising a step of forming a protection film of insulating material after the connection part removing step in such a manner that the protection film covers at least the conductor layer and an upper surface and a side surface of the semiconductor lamination.

11. The method according to claim 1, wherein the semiconductor lamination is formed of GaN-based compound semiconductors.

12. The method according to claim 1, wherein the first semiconductor layer is an n-type semiconductor layer and the second semiconductor layer is a p-type semiconductor layer.

13. The method according to claim 5, wherein the barrier layer has a thickness of 10 to 30 nm.

14. The method according to claim 7, wherein the barrier layer has a thickness of 500 nm or greater.

15. The method according to claim 1, wherein the connection part is removed after forming the barrier layer, the barrier layer covering at least one of the first and the second electrode, and the material constituting at least one of the first electrode and the second electrode is prevented from migrating even when the removal of the connection part causes a difference between the potentials of the first and second semiconductor layers.

* * * * *